US006650673B2

(12) United States Patent
Hong et al.

(10) Patent No.: US 6,650,673 B2
(45) Date of Patent: *Nov. 18, 2003

(54) GENERATION OF SHORT OPTICAL PULSES USING STRONGLY COMPLEX COUPLED DFB LASERS

(75) Inventors: Jin Hong, Nepean (CA); Rongqing Hui, Lawrence, KS (US); Maurice S. O'Sullivan, Ottawa (CA)

(73) Assignee: Bookham Technology, PLC, Abingdon (GB)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/213,088

(22) Filed: Dec. 15, 1998

(65) Prior Publication Data

US 2003/0147434 A1 Aug. 7, 2003

(51) Int. Cl.[7] .............................. H01S 3/19; H01S 3/10; H01S 3/08
(52) U.S. Cl. .............................. 372/50; 372/22; 372/96; 372/102; 372/25
(58) Field of Search .............................. 372/22, 50, 96, 372/102, 25

(56) References Cited

U.S. PATENT DOCUMENTS 5,020,153 A * 5/1991 Choa et al. .................. 455/606
5,726,789 A * 3/1998 Horiuchi et al. ............ 359/184
5,936,994 A * 8/1999 Hong et al. .................... 372/96

FOREIGN PATENT DOCUMENTS

| DE | 195 13 198 A | 10/1996 |
| WO | WO 98/10544 A | 3/1998 |

OTHER PUBLICATIONS

Mamyshev, Dec. 15, 1994, Optics Letters, 2074–2076.*
Weber et al, Feb. 1992, Journal of Quantum Electronics, 441–446.*
Mamyshev et al, Oct. 1991, IEEE Journal of Quantum Electronics, 2347–2355.*
Derickson et al, Oct. 1992, IEEE Journal of Quantum Electronics, 2186–2202.*

(List continued on next page.)

*Primary Examiner*—Paul Ip
*Assistant Examiner*—Armando Rodriguez
(74) *Attorney, Agent, or Firm*—Lahive & Cockfield, LLP

(57) ABSTRACT

A compact source capable of generating continuously tunable high frequency microwave radiation and short optical pulses in the picosecond/sub-picosecond range is invented. It includes a laser structure having two lasers formed on the same substrate which simultaneously operate at different longitudinal modes. Each laser has a complex coupled (gain-coupled or loss-coupled) grating which is formed by deep etching through a multi-quantum well structure, either of the active medium or of the additional lossy quantum-well layers, thus ensuring no substantial interaction between lasers. The lasers have a common active medium and shared optical path and provide mutual light injection into each other which results in generation of a beat signal at a difference frequency of two lasers. The beat frequency is defined by spacing between the laser modes and may be continuously tuned by current injection and/or temperature variation. Thus, the beat signal provides a continuously tunable microwave radiation. To form a train of short optical pulses, the beat signal is either further sent to a saturable absorber followed by a semiconductor optical amplifier, or sent directly into an optical compressor which includes a dispersion fiber. As a result, a duration of each impulse is compressed, and a train of short optical pulses is formed.

106 Claims, 17 Drawing Sheets

OTHER PUBLICATIONS

Mamyshev et al., Oct. 1991, IEEE Journal of Quantum Electronics, 2347–2355, Generation of Fundamental Soliton Trains for High–Bit–Rate Optical Fiber Communications Lines.*

Weber et al, Feb. 1992k, Journal of Quantum Electronics, 441–446, Measurement and Simulation of the Turn–On Delay Time Jitter in Gain–Switched Seminconductor Lasers.*

Mamyshev, Dec. 1994, Optics Letters, 2074–2076, Dual–Wavelength source of high–repetition–rate, transform–limited optical pulses for solition transmission.* derickson et al, Oct. 1992, IEEE Journal of Quantum Electronics, Short Pulse Generation Using Multisegment Mode–Locked Semiconductor Lasers.*

Wake, D., et al, "Optical Generation of Millimeter–Wave Signals for Fiber–Radio Systems Using a Dual–Mode DFB Semiconductor Laser", IEEE Transactions in Mircrowave Theory and Techniques, 43 (1995), Sep. No. 9, Part 2, pp. 2270–2276.

Lima, C.R., et al, "Compact Optical Millimetre–Wave Source Using a Dual–Mode Semiconductor Laser", Electronic Letters, Mar. 2, 1995, vol. 31, No. 5, pp. 364–366.

Wake et al, optical generation of millimeter–wave signals for fiber–radio systems using a dual–mode dfb semiconductor laser, IEEE, 1995, pp. 2270–2275.*

Optical generation of millimeter wave signals for fiber radio systems using a dual mode dfb semiconductor, Wake et al, IEEE transaction on microwave thoery, Sep. 9, 1995, pp. 2270–2275.*

* cited by examiner

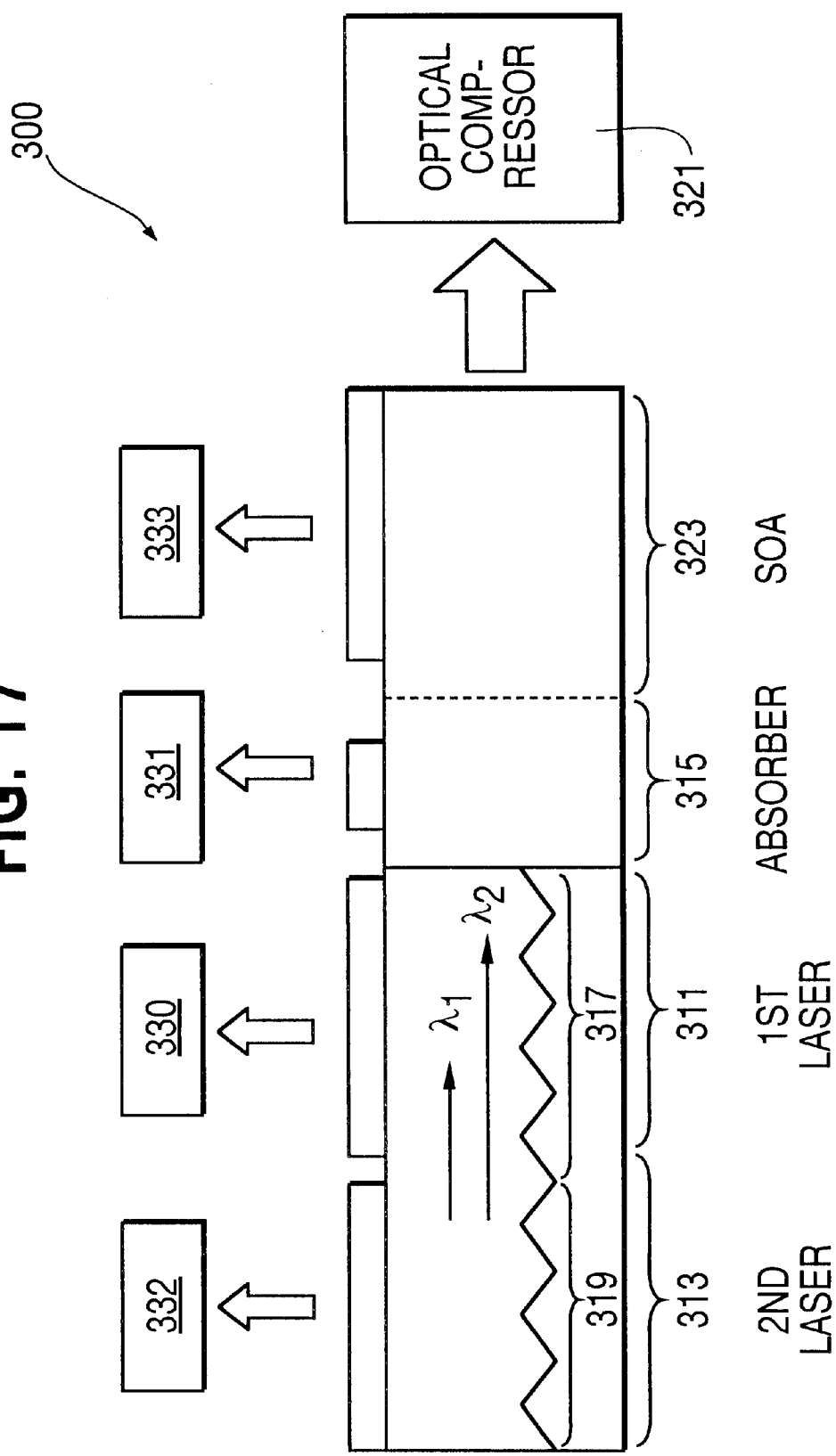

GENERATION OF SHORT OPTICAL PULSES USING STRONGLY COMPLEX COUPLED DFB LASERS

FIELD OF INVENTION

The invention relates to generation of short optical pulses with particular application to transmission of data.

BACKGROUND OF THE INVENTION

Ultra high speed time domain multiplexing (TDM) optical transmission systems in optical fibers require compact light emitting sources capable of generating optical short pulse trains in a picosecond/sub-picosecond range. General requirements for short pulse sources such as soliton sources are narrow pulse width, low time jitter and a continuously tunable repetition rate. For practical fiber optic systems, there are additional requirements of long-term reliability, small size and easy data encoding in the system application.

There are several known methods to generate short optical pulse trains. Complicated passive or active mode locking techniques are available for high speed optical pulse generation where pulses are generated at a fixed repetition rate determined by the roundtrip time of the laser resonator, e.g. D. J. Derickson et al., "Short pulse generation using multi-segment mode-locked semiconductor lasers," IEEE J. Quantum Electron., Vol. 28, pp. 2186–2202, 1992. These techniques are sensitive to phase matching conditions and therefore difficult to build and maintain. Another method is gain switching of lasers which suffer from high time jitter. Pulse generation at repetition rates over 50 GHz is extremely difficult to achieve in this method because of limitations of the device modulation bandwidth and radio frequency supply as described, e.g. in publication by A. G. Weber, W. Ronghan, E. H. Bottcher, M. Schell and D. Bimberg, "Measurement and simulation of the turn-on delay time jitter in gain-switched semiconductor lasers," IEEE J. Quantum Electron., Vol. 28, pp. 441–445, 1992.

High repetition rate optical pulses can also be generated using a dual wavelength light source as described, e.g. in publication P. V. Mamyshev, S. V. Chernikov and E. M. Dianov, "Generation of Fundamental soliton trains for high-bit-rate optical fiber communication lines," IEEE J. Quantum Electron., vol. 27, pp. 2347–2355, 1991. Two wavelengths emitted by two lasers are mixed to form a high frequency sinusoidal signal which is sent though an optical combiner and optical amplifier followed by a nonlinear fiber. As a result the sinusoidal signal is compressed into a train of optical pulses. The common approach of dual wavelength light sources is to use two discrete lasers, which is complex and suffers from the long term stability issue. Dual wavelength operation can also be accomplished by selecting the appropriate phase modulation sidebands from an externally phase modulated light source, e.g. P. V. Mamyshev, "Dual-wavelength source of high-repetition-rate, transform-limited optical pulses for soliton transmission" Opt. Lett., Vol. 19, pp. 2074–2076, 1994. This method requires high frequency modulation and optical filters. In order to make this method more practical two solitary laser diodes are usually used to generate the sinusoidal beat signal. Unfortunately, frequency variations of each laser are subject to both thermal and mechanical fluctuations which result in beat signal frequency fluctuations. Phase noise of both lasers also contribute to the jitter of the beat signal significantly. The control of the polarization from each laser output and the effort to align and maintain them is also a practical issue that decreases the system performance. Therefore, the resulting signal performance is not satisfactory and practical use of such a configuration in commercial ultra high speed applications is in question.

Accordingly, there is a need in the industry for a practical, compact and reliable optical source of continuously tuning high repetition rate short optical pulses which is suitable for optical transmission systems and high speed optical signal processing.

SUMMARY OF THE INVENTION

It is an object of the present invention to provide an optical pulse source which avoids the afore-mentioned problems.

Thus, according to one aspect of the present invention there is provided an optical pulse source, comprising:
- a first single mode DFB semiconductor laser having a first grating for generating light at a first frequency;
- a second single mode DFB semiconductor laser having a second grating for generating light at a second frequency;
- the lasers having a common active medium and shared optical path, the lasers providing mutual light injection into each other resulting in generation of a beat signal at a difference frequency of two lasers;
- an optical compressor disposed to receive the beat signal and compressing the pulse duration of the signal, thus forming a train of short optical pulses having a predetermined duration and a repetition rate.

The source may further include a saturable absorber disposed to receive the beat signal before it is sent to the optical compressor. The absorber provides an initial time compression of the signal, thus transforming the beat signal into an initial train of optical pulses. Additionally, an optical amplifier may be used for amplification the beat signal or the initial train of pulses, e.g. including an erbium doped fiber. The optical compressor may include a dispersion decreasing fiber, a dispersion shifted fiber and/or an external erbium doped fiber amplifier. The source may further include means for data encoding into the train of short pulses, e.g. an optical modulator operating at a speed determined by the repetition rate. A typical range of the repetition rates is from about several tens GHz to about several hundred GHz with a sub-range from about 25 GHz to about 80 GHz being of special importance for data transmission. A typical duration of pulses in the pulse train is within a picosecond/sub-picosecond range.

A source includes gain coupled DFB lasers, or alternatively it may include loss coupled DFB lasers. Preferably, the active medium of the lasers includes a multiple quantum well structure. Advantageously, the first and second gratings in the first and second lasers are formed by etching grooves directly through the multiple quantum well structure. Beneficially, each grating has a period comprising a first section and a second section with substantially all quantum wells being etched away from the second section, thus providing no substantial photon emission in the second section and ensuring no substantial interaction between the lasers. A source may further have means for stabilizing the frequency of one of the first and second lasers, or means for stabilizing frequencies of both lasers. Means for tuning frequencies of the first and second lasers may be provided additionally. To ensure reliable and accurate mode, low frequency modulation of light generated by one of the first and second lasers, may be provided. Alternatively, light generated by the lasers may be modulated simultaneously.

Beneficially, the modulation is provided at a frequency which is subharmonic to the beat frequency.

In the first embodiment a source includes first and second gratings which have same periods, and it is arranged that lasers generate light at the different sides of stopband.

In the second embodiment a source includes first and second gratings which have same periods, and it is arranged that lasers generate light at the same side of stopband. The difference between the first and second frequencies is provided by different current injection into the first and second lasers, or by difference in temperature control of the first and second lasers. Alternatively it may be provided by different width of the active medium in the first and second lasers.

In the third embodiment a source includes the first and second gratings which have different periods.

It is arranged that the frequency of one of the lasers which is remote from an output facet does not fall within a stopband of the other laser which is closer to the output facet so that light emitted by the remote laser can pass through the shared optical path to the output facet.

In the fourth embodiment, instead of pumping the active medium of the source by current injection in to the active medium, the pumping is provided by an external optical pumping source.

In modifications to the embodiments described above, a source may include the first and second gratings which are either uniform or chirped, the gratings preferably being first order gratings which are formed by holographic techniques or electron beam writing onto the active medium.

According to another aspect of the invention there is provided an optical pulse source, comprising:

a first single mode DFB semiconductor laser having a first grating for generating light at a first frequency;

a second single mode DFB semiconductor laser having a second grating for generating light at a second frequency;

the lasers having a common active medium and shared optical path, the lasers providing light injection of light into each other resulting in generation of a beat signal at a difference frequency of two lasers;

a saturable absorber disposed to receive the beat signal and providing an initial time compression thus transforming the beat signal into an initial train of optical pulses;

an optical amplifier disposed to receive the initial pulse train after the absorber;

an optical compressor disposed to receive the pulse train after the optical amplifier and compressing duration of pulses of the train, thus forming a train of short optical pulses having a pre-determined duration and a repetition rate, the first and second lasers, the saturable absorber and the optical amplifier being formed on the same chip.

Conveniently, the lasers, the saturable absorber and the optical amplifier are integrated within a package. According to yet another aspect of the invention there is provided a source of radiation, comprising:

a first single mode DFB semiconductor laser having a first grating for generating light at a first frequency;

a second single mode DFB semiconductor laser having a second grating for generating light at a second frequency;

the lasers having a common active medium and shared optical path and providing mutual light injection into each other resulting in generation of radiation at a beat frequency of two lasers.

Preferably, the source of radiation includes either gain coupled DFB lasers or loss coupled DFB lasers with the active medium comprising a multiple quantum well structure. Advantageously, the first and second gratings are formed by etching grooves directly through the multiple quantum well structure. To provide no substantial interaction between two lasers, it is arranged that each grating has a period comprising a first section and a second section with substantially all quantum wells being etched away from the second section, thus providing no substantial photon emission in the second section. A typical wavelength range of the radiation generated by the source corresponds to microwave to millimeter wavelength range.

Conveniently, the first and second gratings have same periods, and it is arranged that the first and second lasers generate light at the same side of stopband. The difference between the first and second laser frequencies may be provided by different current injection into the first and second lasers, by different width of the active medium in the first and second lasers and/or by difference in temperature control of the first and second lasers.

Alternatively, a source of radiation may include gratings having same periods while the first and second lasers generate light at different sides of stopband. In yet another alternative a source may include the first and second gratings having different periods. It is also provided that the frequency of one of the lasers which is remote from an output facet does not fall within a stopband of the other laser which is closer to the output facet so that light emitted by the remote laser can pass through the shared optical path to the output facet. Conveniently, the source may further include means for modulation of light generated by one of the first and second lasers at a frequency which is subharmonic to the beat frequency. Advantageously, the source is formed on a chip and integrated within a package.

BRIEF DESCRIPTION OF THE DRAWINGS

The invention will now be described in greater detail regarding the attached drawings in which:

FIG. 17 is a schematic view of an optical pulse source according to a fourth embodiment of the invention.

DESCRIPTION OF PREFERRED EMBODIMENTS
STRUCTURE AND OPERATION

Figure 1:
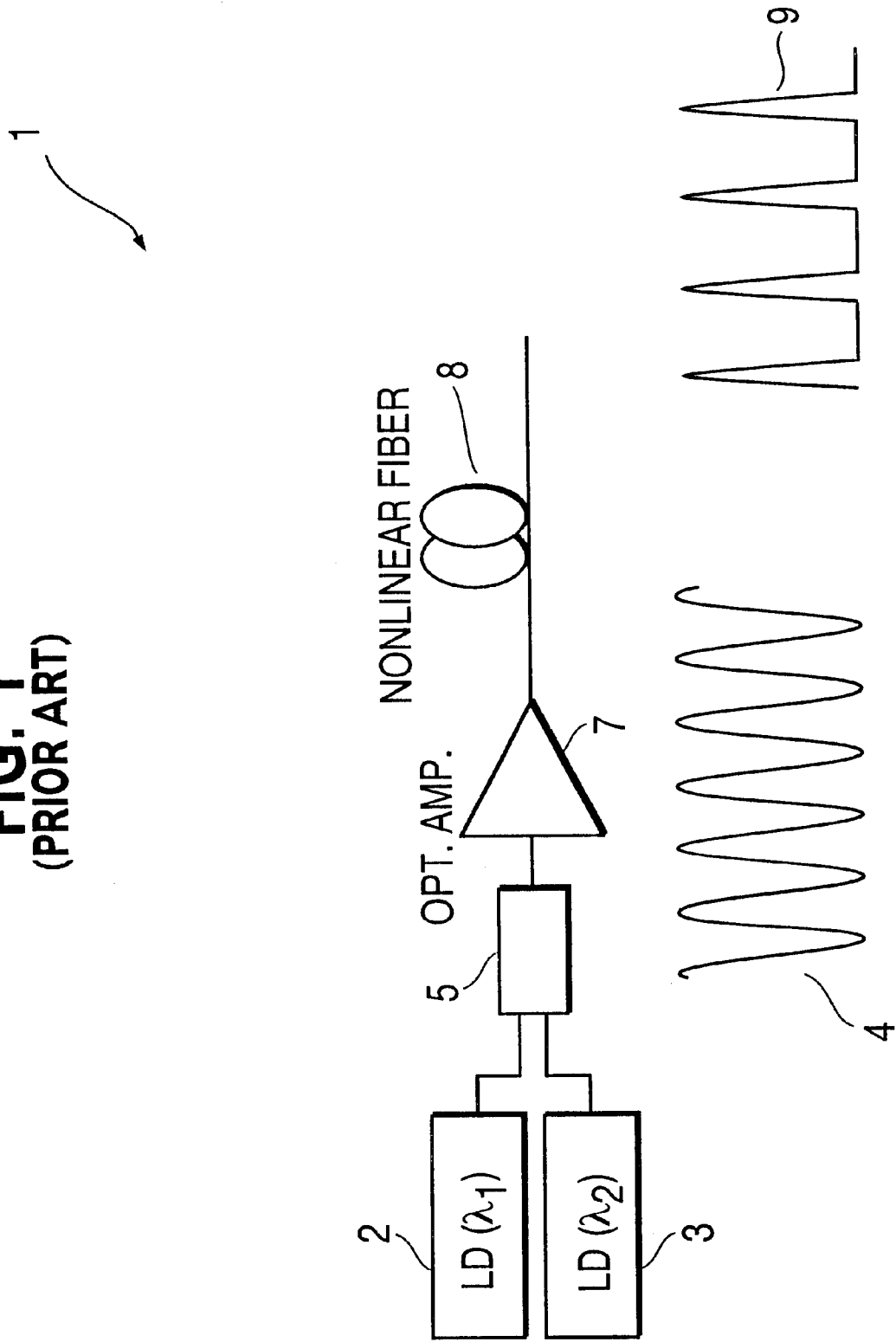
FIG. 1 shows a schematic view of a prior art optical pulse source.

The prior optical pulse source 1 is schematically shown in FIG. 1. Light generated at first and second wavelengths $\lambda_1$ and $\lambda_2$ by first and second lasers 2 and 3 is mixed to form a high frequency sinusoidal signal 4 at difference beat frequency. The beat signal is further sent though an optical combiner 5 and optical amplifier 7 followed by a nonlinear fiber 8 where the initial pulse is amplified, chirped and then compressed by the nonlinear Kerr effect. As a result, the sinusoidal signal 4 is compressed into a train of optical pulses 9 as illustrated in FIG. 1.

Figure 2:
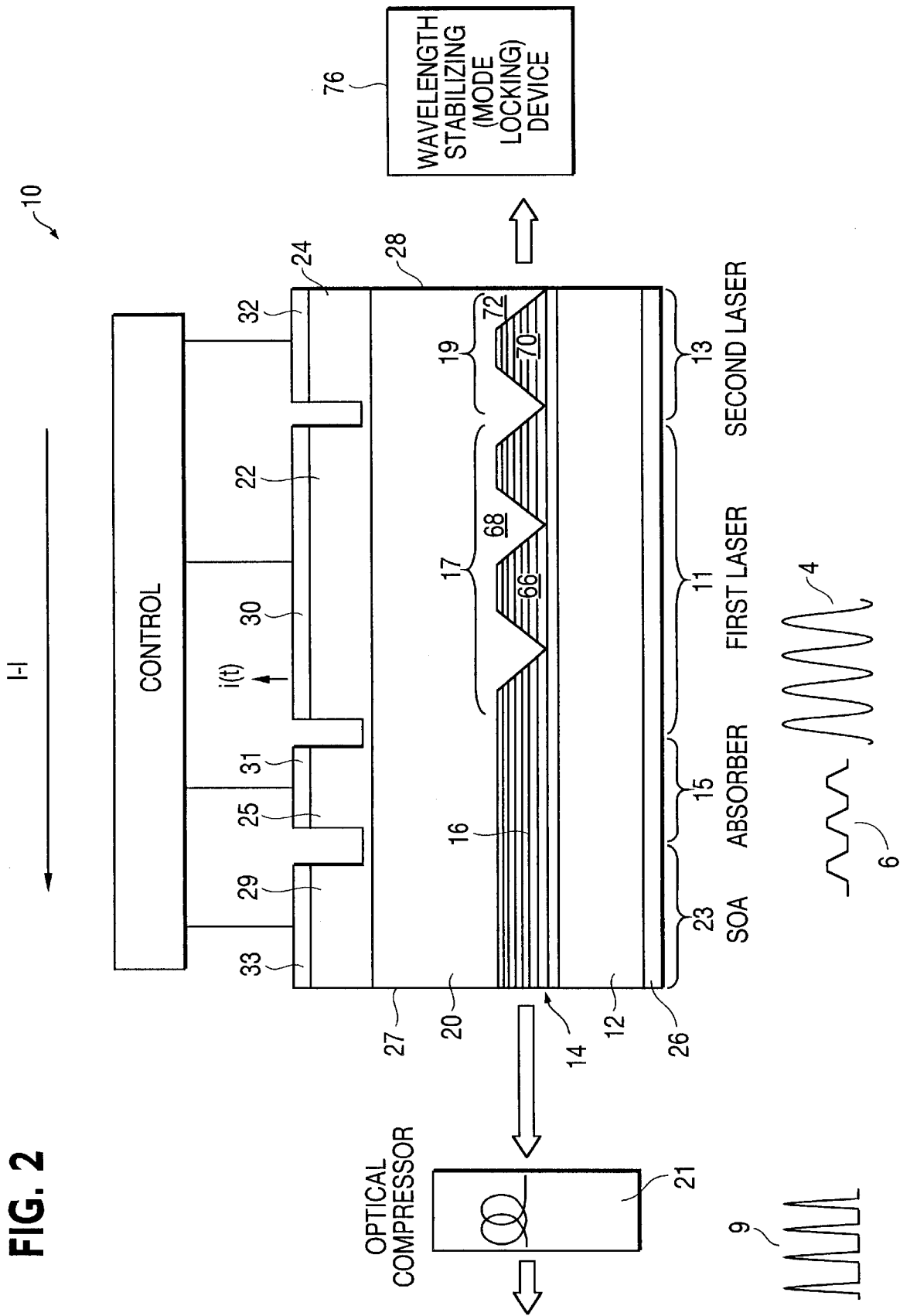
FIG. 2 shows a schematic cross sectional view of an optical pulse source according to a first embodiment of the invention.

A schematic cross section through a source of short optical pulses 10 according to a first embodiment of the present invention is shown in FIG. 2. The source 10 comprises a first gain coupled DFB laser 11 and a second gain coupled DFB laser 13 having their cavities arranged coaxially along same optical axis, designated by a numeral I-I in FIG. 1. Lasers 11 and 13 have outputs arranged along the line I-I and in the same direction shown by an arrow on the line I-I, the first laser 11 being closer to an output facet 27. The source 10 is formed on a substrate 12 providing a first confinement region, an active medium 14 comprising a multiple quantum well structure 16 and a first and second uniform gratings 17 and 19 defined therein, and an overlying confinement region 20. Means for excitation the first and second lasers are formed thereon, and include a contact to the substrate 26, first and second current confining ridges 22 and 24, first and second contact electrodes 30 and 32 being defined on each ridge respectively for current injection into the laser structure. The first and second gratings 17 and 19 positionally correspond to the first and second lasers 11 and 13 respectively. The gratings have same grating periods, and lasers 11 and 13 have different length so that they will behave differently in lasing operation. For example, in the device shown in FIG. 2, the first section is 150 micrometers long and the second section is 550 micrometers long. The lasers provide a dual wavelength operation, i.e. each laser provides a stable generation at its own frequency/wavelength in the presence of another laser. In the first embodiment it is arranged that lasers 11 and 13 generate at different sides of a DFB stopband, e.g. the laser 11 generates at the left Bragg mode of the stopband, while the laser 13 generates at the right Bragg mode of the stopband. Therefore the wavelength/frequency spacing of the lasers is determined by the stopband width. The lasers 11 and 13 have a common active medium 14 and shared optical path to the output facet 27 and provide mutual injection of light into each other. Due to mutual injection of light into each other, a sinusoidal optical beat signal is generated by the lasers, with the frequency spacing defined by the wavelength spacing between the two stable operated modes. The frequency spacing is fine tuned to the specific frequency spacing required in the system by current injection into the lasers 11 and 13. The beat signal is a source of tunable radiation having a typical wavelength within a microwave to millimeter range.

Both gratings 17 and 19 are made by periodic etching grooves through the active medium 14, the depth of etching being defined so as to provide a substantial insensitivity of each laser to the external feedback and random facet variations and thereby ensuring no substantial interaction between lasers in the series as will be also described in detail below. An additional short section of a reversely biased saturable absorber 15 and a semiconductor optical amplifier (SOA) 23, both with no grating written onto the active medium, are added on the same chip. By doing so, all the sections are naturally aligned and the polarization state is maintained through the device. Means for current injection into the absorber 15 and amplifier 23 sections are formed similar to that of the laser excitation means described above and include current confining ridges 25 and 29 respectively, with corresponding contact electrodes 31 and 33 being defined on each ridge as shown in FIG. 2. As illustrated in FIG. 2, the beat signal 4 is received by the saturable absorber 15 which provides a partial initial compression of pulse duration and forms an initial optical pulse train 6 which is amplified by SOA 23. Then the initial optical pulse train 6 is further compressed by an optical compressor 21 including dispersion fiber in such a way that the initial amplified train is transformed into a train of short optical pulses 9 having a pre-determined duration and a repetition rate. The resulting short optical pulse train 9 is further data encoded with a high speed external optical modulator (not shown), which operates at a speed of the frequency spacing determined by the wavelength spacing in the lasers 11 and 13. Optionally, light generated by one or two lasers is modulated at a frequency which is subharmonic to the beat frequency, and/or frequencies of one or both lasers are stabilized by a wavelength locking device.

The beat signal 4 may be sent directly to the optical compressor 21, where the initial pulse is amplified, chirped and then compressed by the nonlinear Kerr effect. Therefore an internal (e.g. SOA 23) or additional optical amplifier is required to amplify the signal before it is compressed. The saturable absorber 15 is used to provide an initial pulse compression and thus to reduce requirements to the optical compressor, e.g. to use shorter lengths of dispersion shifted fiber or dispersion decreasing fiber.

Figure 3:
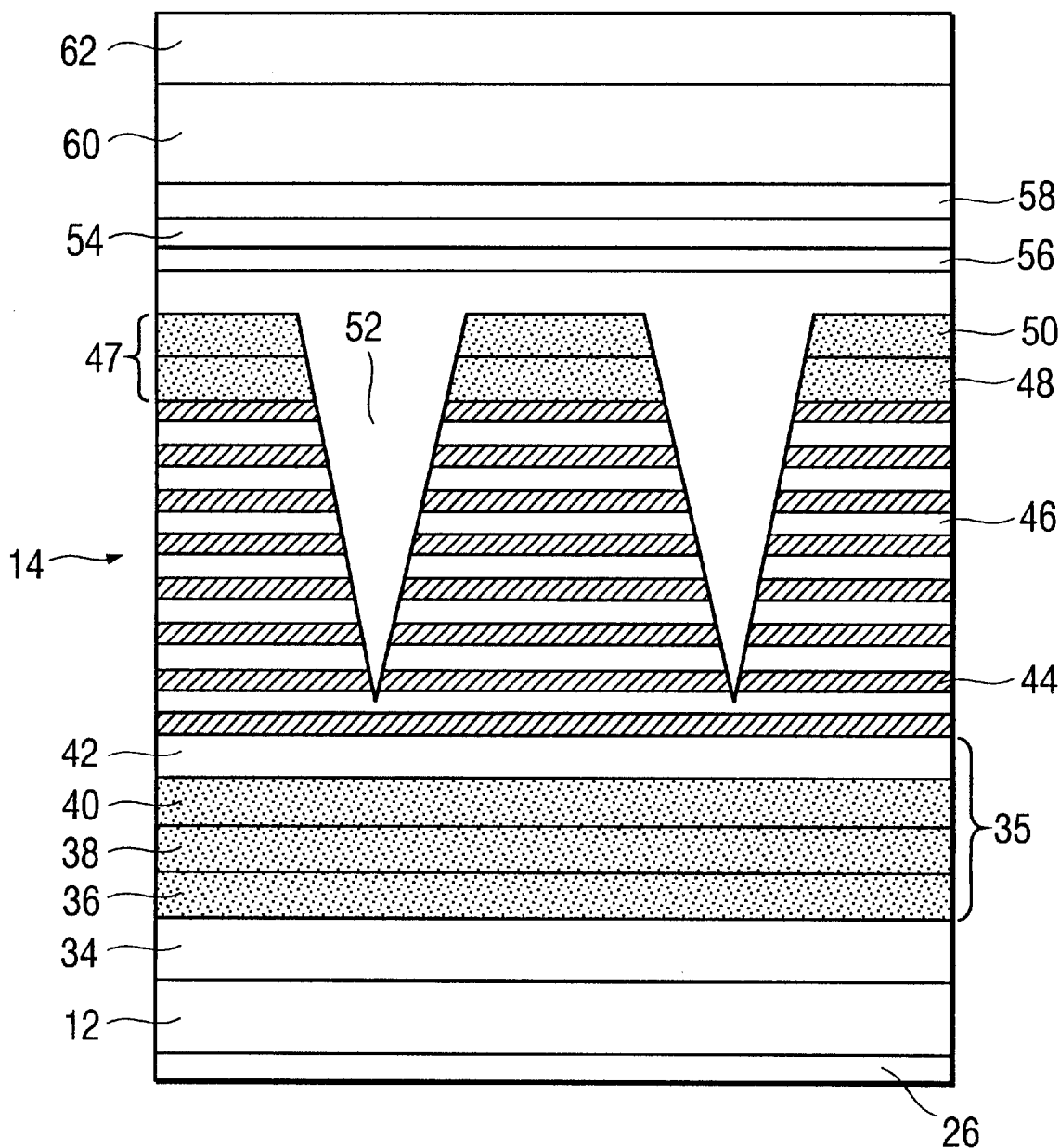
FIG. 3 shows a detailed cross sectional view of the laser structure of the source of FIG. 2.
Figure 4:
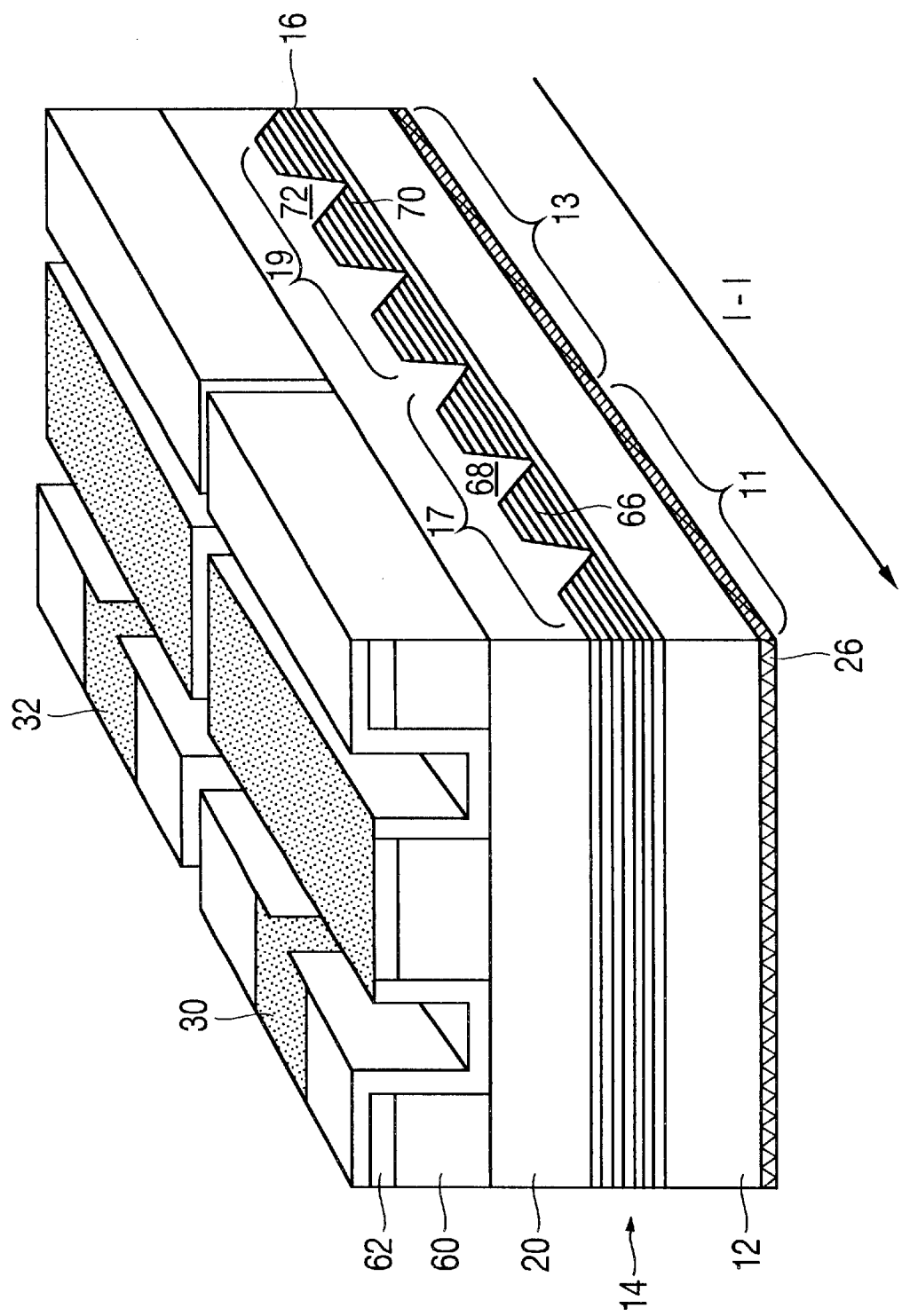
FIG. 4 shows a schematic perspective view of the laser structure of the source of FIG. 2.

The structure of the lasers 11 and 13 forming the source 10 is shown in more detail in FIG. 3, which illustrates an oblique cross-sectional view through the laser part of the source structure 10, and FIG. 4 which shows a perspective view of the source 10. The DFB 25 semiconductor laser source 10 is fabricated from Group III-v semiconductor materials, and comprises a heavily N-doped InP substrate 12, on which an N-doped InP buffer layer 34 of 1.5 $\mu$m thickness is defined. The first separate confinement region 35, consisting of four confinement layers 36, 38, 40 and 42 of N-doped InGaAsP with energy band gaps corresponding to wavelengths of 1.0 $\mu$m, 1.1 $\mu$m, 1.15 $\mu$m and 1.20 $\mu$m respectively, is provided over the buffer layer 34. The thickness of each confinement layer is 20 nm, and the confinement layer 36 corresponding to the 1.0 $\mu$m wavelength is adjacent to the buffer layer 34. The active region 14 overlies the confinement region 35 and comprises a multiple quantum well (MQW) structure 16 which includes four to eight 1% compressively strained N-doped, or undoped InGaAsP quantum wells 44, each being 5 nm thick, separated by several undoped or P-doped InGaAsP unstrained barriers 46 with a band gap corresponding to wavelength of 1.20 μm, each barrier being 10 nm thick. The alloy composition and layer thickness of the MQW structure 16 are tailored to have specific band gap energies to provide for lasing at a required wavelength. Increasing the number of quantum wells provides higher gain per unit length of the laser cavity. The band gap of the quantum well structure described above provides a lasing wavelength of the device at about 1.55 μm. A second separate confinement region 47, consisting of two P-doped InGaAsP confinement layers 48 and 50, having energy band gaps corresponding to 1.1 μm and 1.20 μm wavelengths respectively, is grown on top of the MQW active region 14, each layer being 20 nm thick.

As mentioned above, gratings 17 and 19 are defined by periodically etched grooves through the active medium 14. The pitch of the groove of each grating is selected so as to define a first order grating for the lasing Bragg wavelength. Grating 17 has a period comprising a first section 66 and a second section 68 as shown in FIGS. 2 and 4. Grating 19 has corresponding first and second sections 70 and 72. Second sections 68 and 72 in the respective gratings 17 and 19 are V-shaped and characterized by substantial etching away almost all quantum wells, namely, seven out of eight quantum wells in this embodiment. The more quantum wells are etched away from the section the less is the photon generation in the section. Thus, a deep etching through the second sections 68 and 72 provides no substantial photon emission in these sections. Usually deep etching is avoided for a single laser because of the accompanied strong index coupling.

For the series of DFB lasers, deep etching provides substantially independent generation of each laser in the series and no substantial interaction between lasers as will be described below.

A P-doped InP layer 52, fills the grooves of the gratings. A 3 nm thick etch stop layer 54 of P-doped InGaAsP, surrounded by P-doped InP buffer layer 56 at the bottom and P-doped InP buffer layer 58 at the top is formed next, the buffer layers being 100 nm and 200 nm thick correspondingly. An upper cladding layer 60 of P-type InP, followed by a highly doped P-type capping layer 62 of InGaAs for contact enhancement, having thickness 1600 nm and 200 nm correspondingly, complete the structure. The separation between the adjacent electrodes 30 and 32 is in the range of 5 to 15 μm to ensure both a sufficient electrical isolation between the adjacent electrodes and a limited material absorption loss. A bottom electrical N-contact 26 is provided at the bottom of the substrate 12. Corresponding means (not shown) for simultaneous two-wavelength generation of the lasers 11 and 13, means for controllably varying current injection and changing temperature of each laser for switching between lasing modes, preferably within a time interval of several nanoseconds, and tuning of laser wavelength of each laser around a corresponding lasing mode are provided.

Thus, a source 10 of short optical pulses and micrometer/millimeter wavelength radiation is provided.

While the source described above is fabricated on N-type substrate wafer, alternatively, a complimentary structure may be fabricated on a P-type wafer.

The substrate 12 on which the source 10 described above is fabricated is made of InP material which results in generating light by lasers 11 and 13 within a range of 1.3–1.56 μm, corresponding to a transparency window of this material. In modifications of this embodiment, the substrate may be made of GaAs material, having a window of transparency in a shorter wavelength range of 0.8–0.9 μm, which results in generating light in this wavelength range.

In modifications of this embodiment, a source 10 may comprise a first 11 and a second 13 strongly loss coupled DFB lasers, each laser comprising a loss coupling grating 17 and 19 correspondingly, and Bragg modes of the lasers being at different sides of the stopband. Deep etching through the quantum wells of the active regions provides strong loss coupling and independent generation of each laser. Other arrangements of laser wavelengths, providing simultaneous operation of two lasers and ensuring generation of the beat signal, are also possible.

A height and a shape of the first and second sections of gratings periods may also vary to define photon emission in the sections, which, for example, have rectangular or trapezoidal shape. The grating may be formed by either direct electron beam writing, phase mask printing, or double exposures.

An optical amplifier 23 which is built on the same chip as the other sections of the optical pulse source, may be substituted with an additional amplifier, e.g. an external EDFA. Alternatively, both types of amplifiers, may be used simultaneously.

The optical compressor 21 may include a dispersion decreasing fiber as described above, or alternatively, a combination of dispersion shifted fiber and normal single mode fibers.

Principles of operation, demonstrated on the source of DFB lasers 10 of the first embodiment of the invention, are as follows.

It is known that complex coupled lasers provide an additional advantage over index coupled and quarter-wavelength shifted DFB lasers in suppressing one of the two originally degenerated Bragg modes. Both theory and experiment have confirmed that in-phase gain coupled DFB laser will predominantly lase on a longer wavelength side of the stop band (right Bragg mode), while the anti-phase loss coupled DFB laser will predominantly lase on a shorter wavelength side of the stop band (left Bragg mode).

For a gain coupled laser 11 with a grating 17 formed by direct etching through the active region, the second section of the grating period 68 where a portion of quantum wells is etched away, has smaller effective refractive index than the first section of the grating period 66 where the quantum wells are not etched at all.

From a standing wave point of view, the first section 66 having higher refractive index, will support a photon emission at the longer wavelength, while the second section 68 having smaller refractive index, will support a photon emission at the shorter wavelength. Since there are more quantum wells in the first section 66 with a higher refractive index section, the emission at the longer wavelength will dominate. Nevertheless, if only a small portion of the quantum wells is etched away from the second section 68 of the grating period, a noticeable photon emission will be still generated in this section.

In this case, there will be a chance that laser 11 will generate at the short wavelength (left Bragg mode) as a dominant mode on certain occasions, when a combination of external facet phases or external feedback phases is in favour to the short wavelength, the situation being typical for index coupled lasers. In order to eliminate such an unpredictable combination of phases, in the laser of the embodiment substantially all quantum wells from the second section 68 of the grating period are removed, to ensure that no substantial emission is originally generated in this section. This results in the photon emission in the first section 66 predominantly, and hence, in lasing at the longer wavelength side of the stop band (right Bragg mode) only. The lasing mode of such a laser is therefore determined by an internal built-in and distributed mode selection means, for example, by the grating defined by deep etching rather than by the external facet phase and coating asymmetry. When arranged in a series, each of such lasers, being phase insensitive and providing stable single mode operation under almost all phase combinations, ensures almost independent operation of each laser and no substantial interaction between the adjacent lasers. We have called such a laser a "strongly gain coupled DFB laser" and utilized it as a building block for the source of short optical pulses and microwave radiation 10.

Thus, the lasers 11 and 13 generate a single wavelength light simultaneously, each at its own side of the stopband, and thus produce the beat signal 4 in the microwave to millimeter wave range. As briefly described above, the beat signal 4 is sent to the saturable absorber 15 followed by SOA 23. The length of the absorber 15 is short enough (typically in the range from several tens of micrometers) in order to set a necessary threshold for optical power level. Because of to the difficulty of cleaving it may be technically difficult to create a short section with the precise length at the end of the device.

Thus is partially compensated by forming the optical amplifier section 23. The signal after SOA 23 is additionally amplified by an EDFA to 23 dBm and passed through 4.4 km of dispersion shifted fiber followed by 1 km normal single mode fiber (not shown). The reason for using dispersion shifted fiber is to generate nonlinear phase modulation. The normal single mode fiber is used to provide an adequate amount of chromatic dispersion to compress the pulse. Alternatively, a 1 to 2 km of dispersion decreasing fiber can be used for pulse compression.

Lengths of different sections are selected so that to make each of the two DFB lasers reasonably long, typically in the range of 150 μm to 500 μm depending on coupling grating strength. It ensures that each laser can be viewed as an independent DFB laser with a sufficient immunity to possible external optical feedback and random facet phase variation. The kL value for each laser is preferred to be within 2 to 8 but not limited to this range.

In order to ensure long term stability of one of the lasing wavelengths, e.g. the wavelength generated by the laser 13, a compact and external wavelength locking device 76 is placed in the close proximity of a rear facet 28 of the laser 13 to be locked. A wavelength locking device using Fabry-Perot etalon and described in U.S. Pat. No. 5,825,792 to Villeneuve (which is incorporated herein by reference) is used. Other known wavelength locking techniques are also applicable.

To ensure reliable and accurate wavelength locking, a different low frequency dithering current, other than the subharmonic modulation signal is applied to the laser 13 on top of the CW bias current in order to dither the output wavelength of the laser. As a result the external wavelength locking device distinguishes the lasing wavelength from the laser 13 and then locks it to greater accuracy without being disturbed by wavelength fluctuations produced by the other laser. In order to further lock two wavelengths with a stable channel spacing and to reduce phase noise and linewidth substantially, a sub-harmonic modulation current i(t) shown in FIG. 2 is applied to the electrode 30 at a frequency $f_m=(f_2 f_1)/N$. Here $f_m$ is a frequency of the modulation current i(t), $f_1$ and $f_2$ are frequencies of the two lasing modes whose difference is assume to be already tuned to the required beat frequency spacing, and N is an integer.

Figure 5:
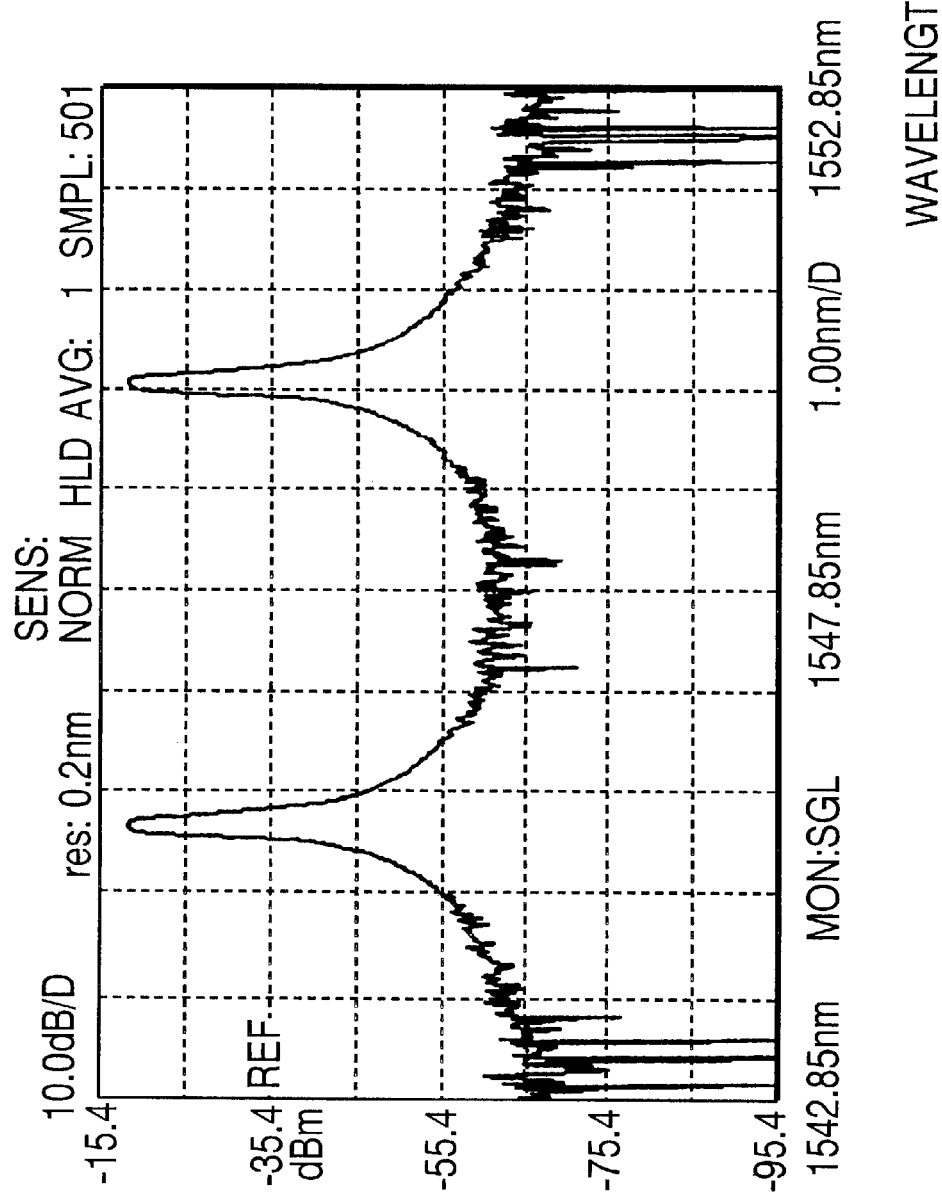
FIG. 5 shows a dual-wavelength operation of the laser structure of the source of FIG. 2.
Figure 6:
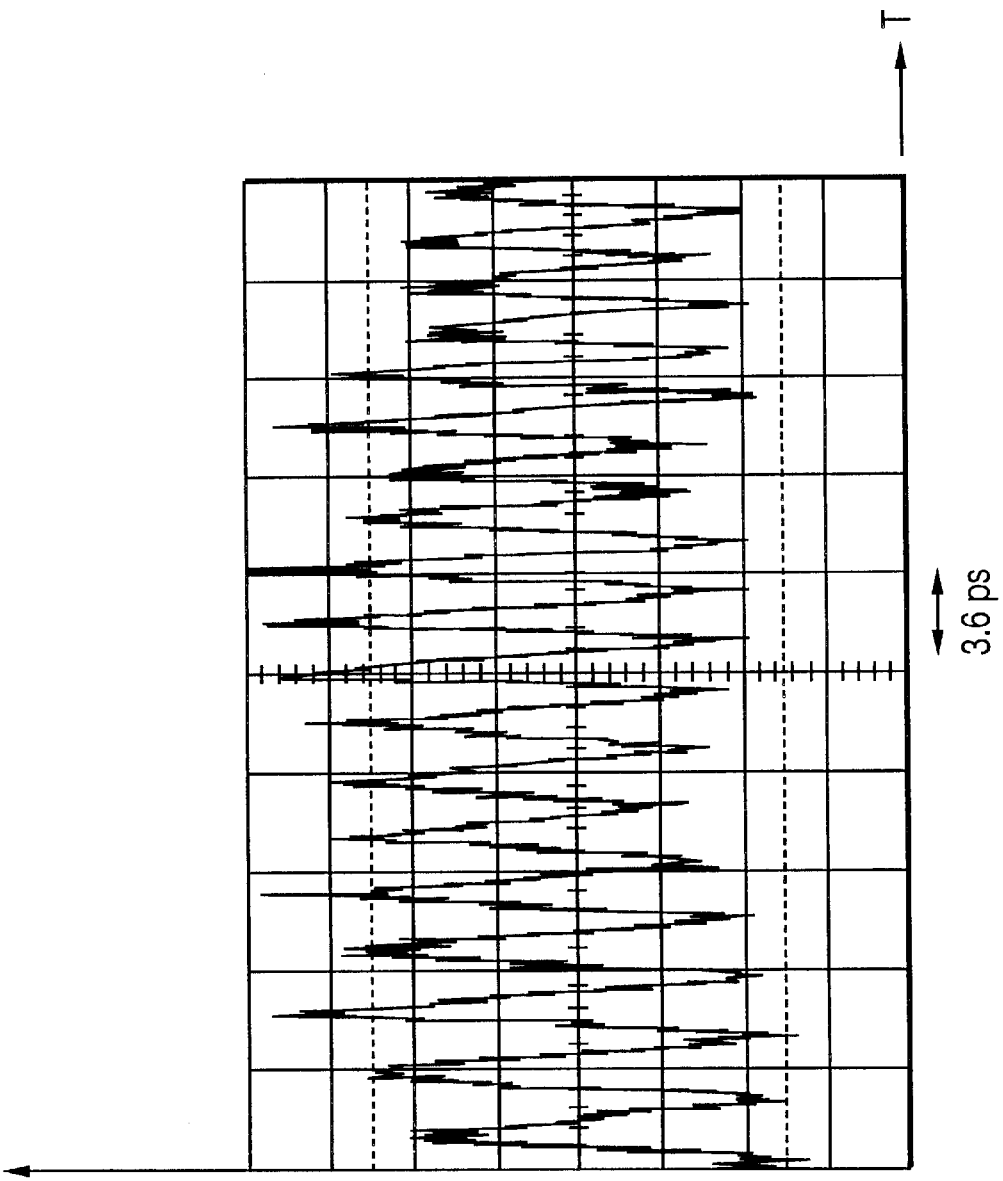
FIG. 6 shows an autocorrelation trace of a beat signal obtained from the dual-wavelength operation illustrated in FIG. 5.

FIG. 5 shows a dual wavelength operation gain coupled DFB lasers 11 and 13 with uniform gratings 17 and 19 across the active medium 14 according to the first embodiment of the invention. The dual wavelength operation shown in FIG. 5 exhibits a beat frequency of about 538 GHz. It is further illustrated by FIG. 6, where an autocorrelation trace of the beat signal of FIG. 5 is recorded through the second harmonic generation device (an optical autocorrelator). As shown in FIG. 6, a resulting CW signal with a period between maxima/minima roughly equal to 1.9 ps is obtained which corresponds to the beat frequency of about 538 GHz. Correspondingly, the laser structure including lasers 11 and 13 can be used as a simple and flexible high frequency (microwave to millimeter wave) generator. A subharmonic injection locking is required to further reduce the linewidth of the high frequency signal and to stabilize the frequency. After passing through the SOA 23, the signal is additionally amplified by an EDFA to 23 dBm and sent through 4.4 km of dispersion shifted fiber followed by 1 km normal single mode fiber (not shown). The resulted compression forms short pulses having a duration of about 1.2 picosecond.

A fine tuning of laser frequencies by current injection and/or temperature variation providing a continuously varying repetition rate for the pulses in the optical train is also provided.

It is worth noting that the dual-mode operation of the lasers mentioned above is fundamentally different from the conventional multi-mode lasers, where modes are competing between each other which is commonly referred to as mode partitioning. In order to verify that there is no competition between the two modes in the lasers, a tunable optical filter was used to select only one mode and sent it into a photodiode (DC - 6 GHz). Using an oscilloscope, the optical power fluctuation, if there was any, of the selected mode was observed. The result of the measurement shows that power fluctuations are less than 3%, which might be induced by current or temperature fluctuations. It proves that mode competition does not exist in the laser structure used in the source 10.

A source 100 of short optical pulses according to a second embodiment of the invention is similar to that of the first embodiment described above except for the lasers 11 and 13 generating at the same side of the stopband and having laser cavities of approximately the same length.

Figure 7:
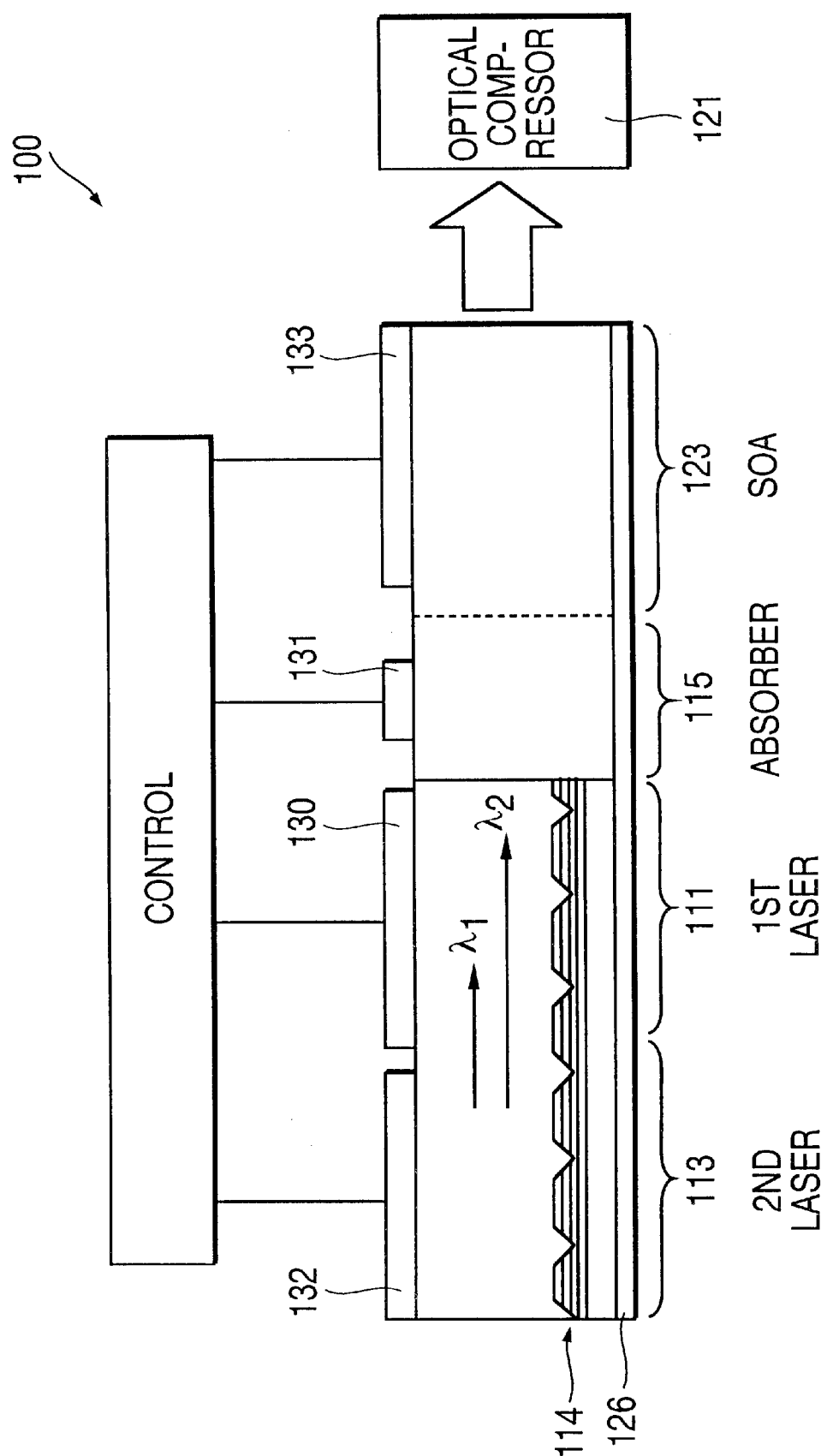
FIG. 7 is a schematic view of an optical pulse source according to a second embodiment of the invention.

As schematically shown in FIG. 7, it includes a first laser 111 generating at a first wavelength $\lambda_1$, and a second laser 113 generating at a second wavelength $\lambda_2$ followed by a saturable absorber 115, SOA 123 and an 15 optional optical compressor 121 formed on the same chip.

The wavelength difference between two lasers is provided by different current injections into the lasers trough corresponding electrodes 130 and 132. It was chosen that each laser generated at the right Bragg mode (the longer wavelength side of the stopband), and the frequency spacing between lasers was fine tuned by changing injection currents. The source 100 of the second embodiment is especially suitable for a relatively low frequency generation in the range of several tens of GHz, where data encoding can still be handled by existing electro-optic modulators. In practice, there is no limitation for a maximum wavelength separation. However, a minimum wavelength separation is limited by the effect of an optical injection locking as discussed, e.g. in publication by R. Hui, A. D'Ottavi, A. Mecozzi and P.

Spano, "Injection locking in distributed-feedback semiconductor lasers." IEEE J. Quantum Electron., Vol.QE-27, pp. 1688, 1991. In order to ensure stable dual wavelength operation and keep away from injection locking between the two wavelengths, the lower limitation of wavelength separation for this embodiment is typically in the order of 20 GHz.

Figure 8:
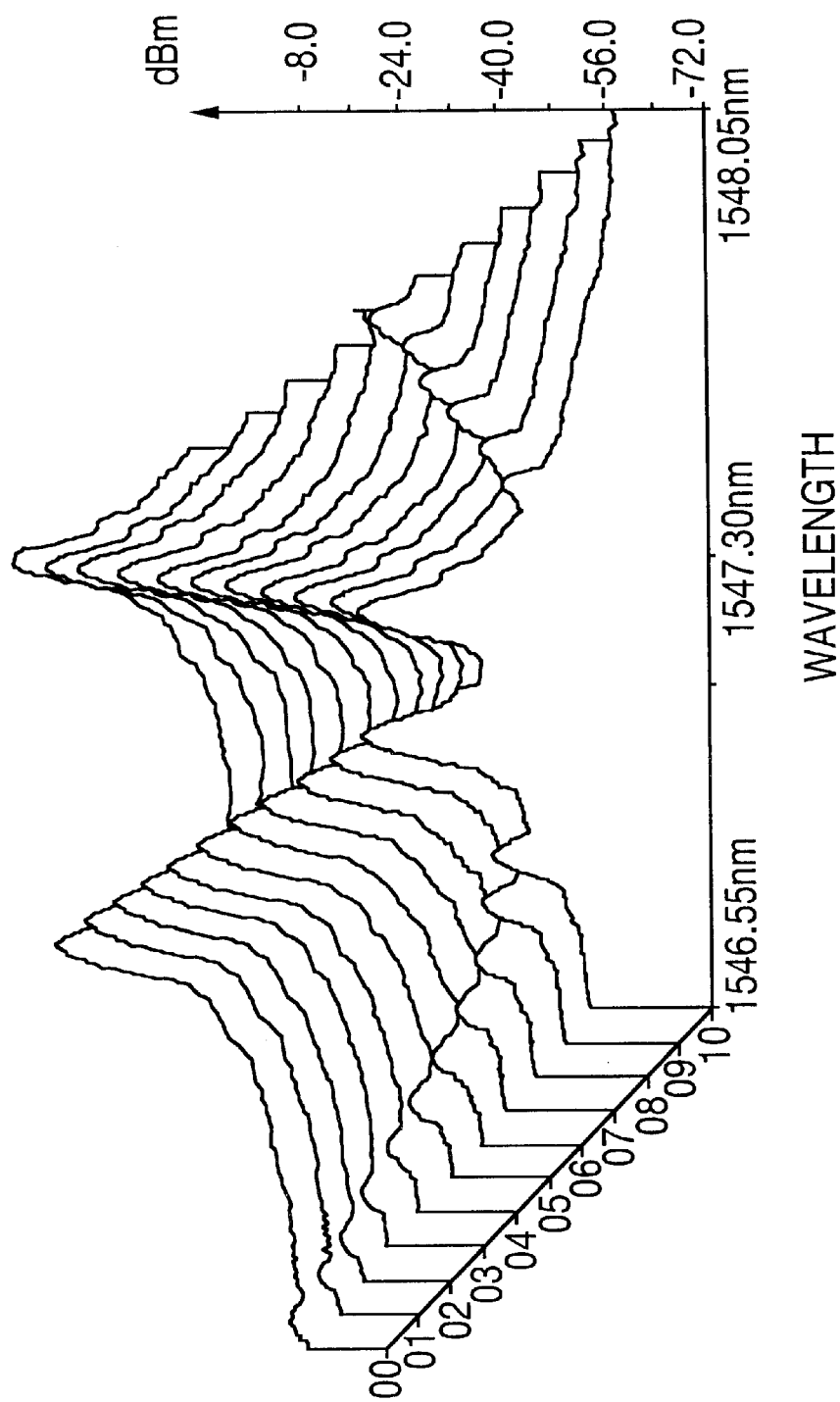
FIG. 8 shows a continuously tunable optical spectrum of the laser structure of the source of dual wavelength operation in FIG. 7 where both the absorber and the SOA are not present in the demonstration device.
Figure 9:
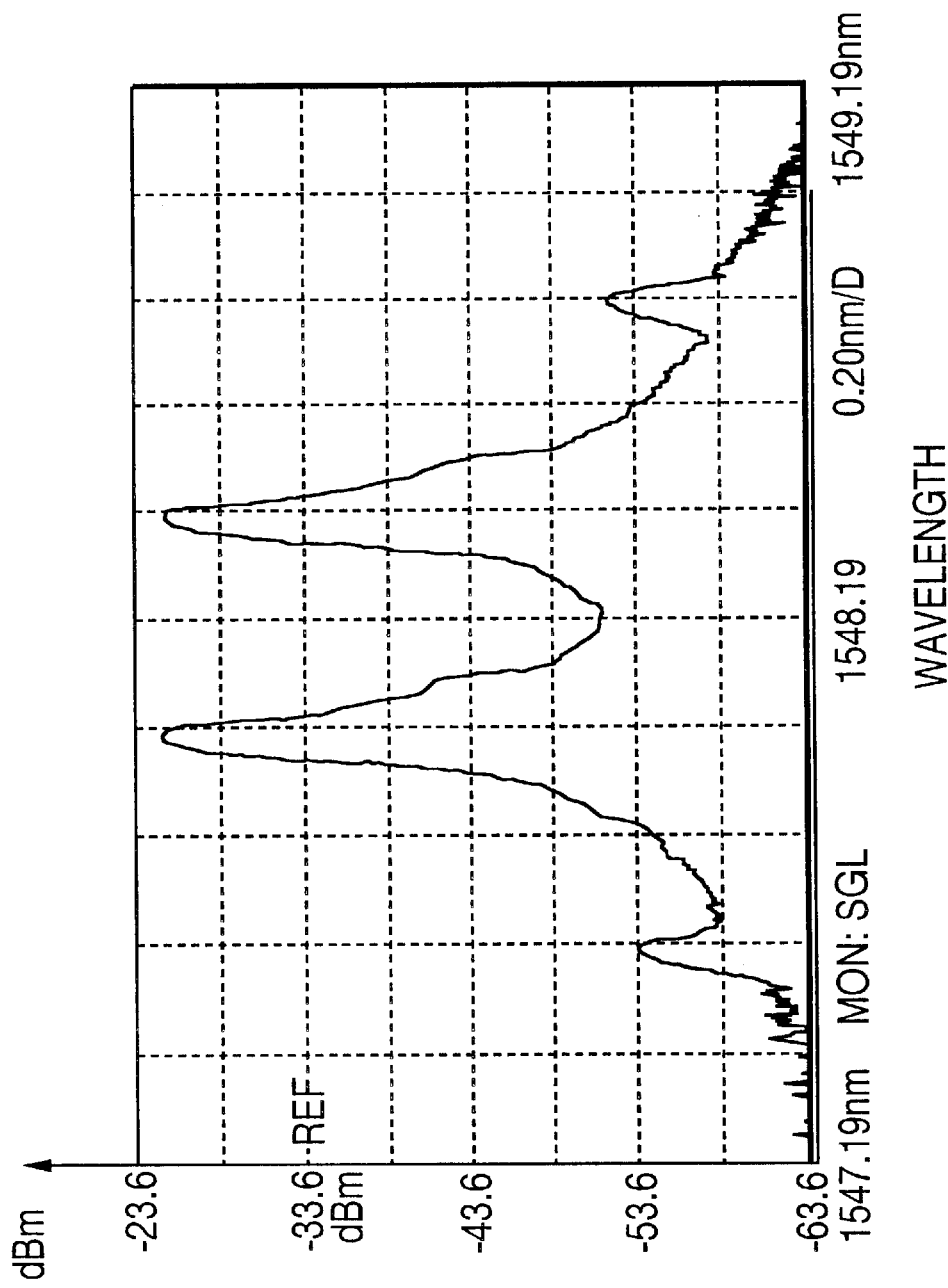
FIG. 9 shows a dual-wavelength operation of the laser structure of the source of FIG. 7 corresponding to a beat frequency 50 GHz.
Figure 10:
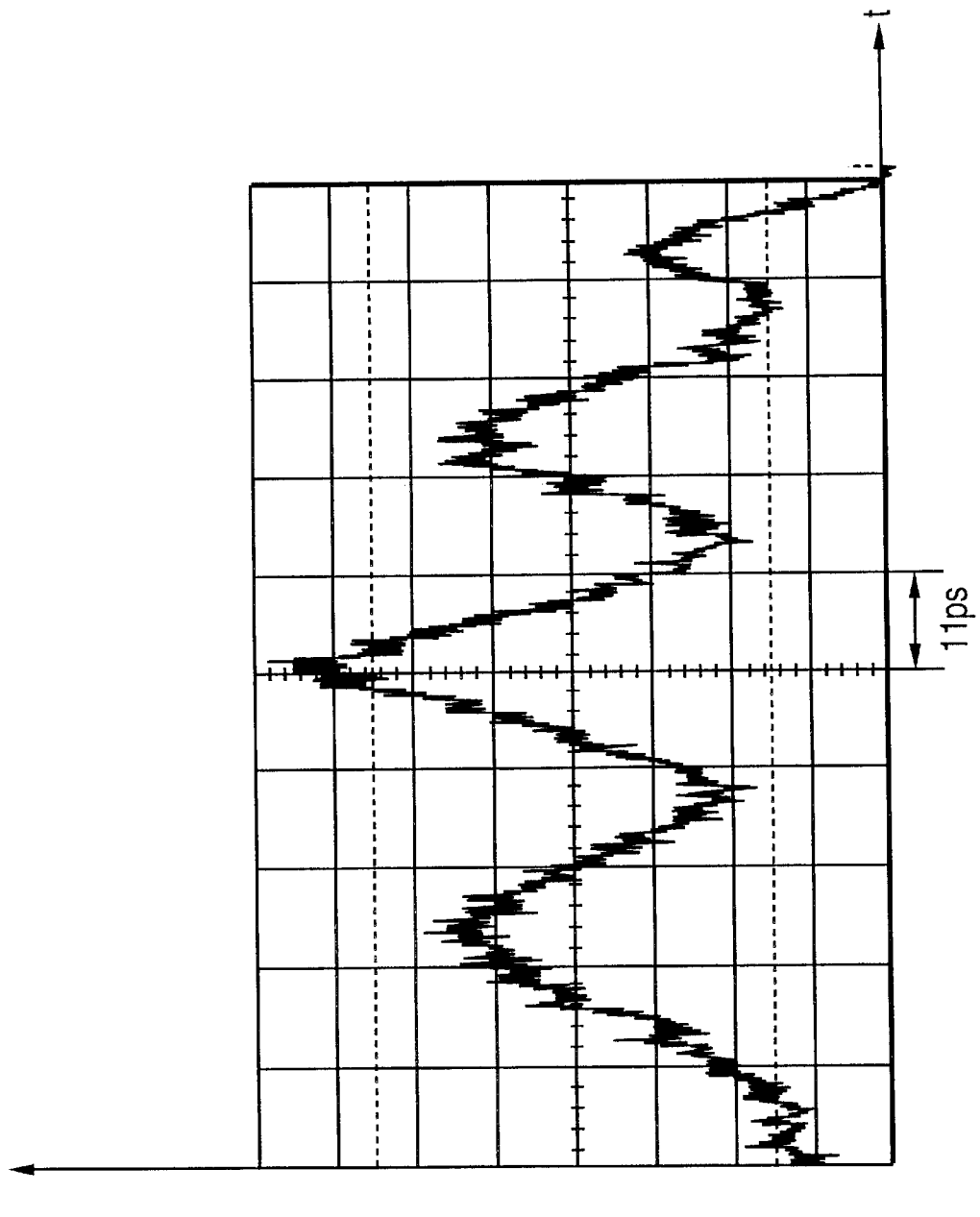
FIG. 10 shows an autocorrelation trace of a beat signal obtained from the dual-wavelength operation illustrated in FIG. 9.

A continuously tunable optical spectrum of the laser structure comprising lasers 111 and 113 of the source 100 is demonstrated in FIG. 8. Since the wavelength spacing can be tuned from 25 GHz to 80 GHz continuously by current injection alone, a flexibility of generating a CW microwave signal with a tunable frequency can be easily obtained. FIG. 9 illustrates a dual wavelength operation of lasers 111 and 113 of the source 100 resulting in generation of microwave radiation with at 50 GHz. It is also demonstrated by an optical autocorrelation trace of the 50 GHZ beat signal shown in FIG. 10 which corresponds to a period between peaks of about 20 ps. The two small peaks at each side of the main modes are four-wave mixing side bands. They are created by population pulsation at the beat frequency between the two major stable modes.

Figure 11:
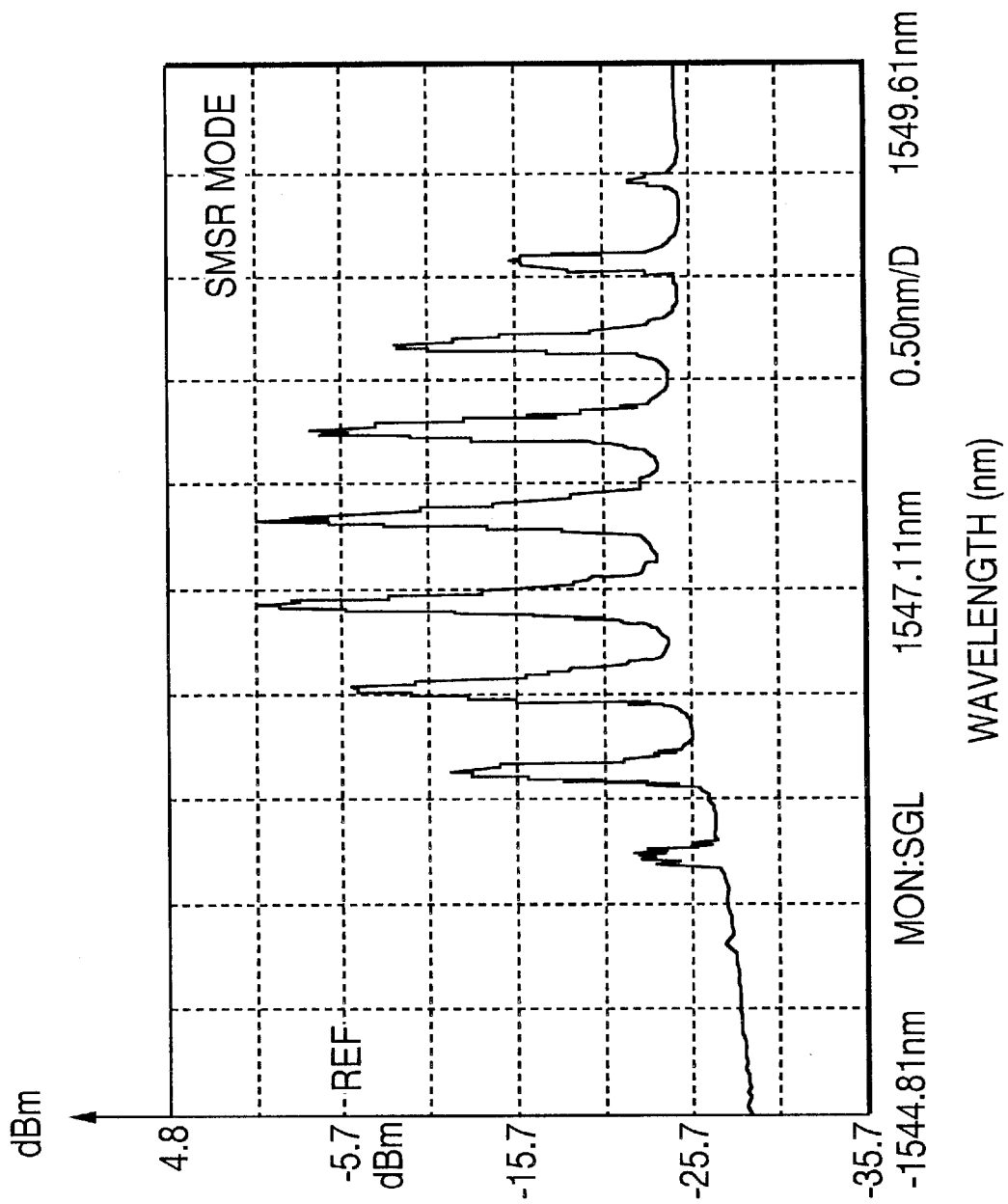
FIG. 11 shows an output optical spectrum after pulse compression for an input signal of FIG. 9.
Figure 12:
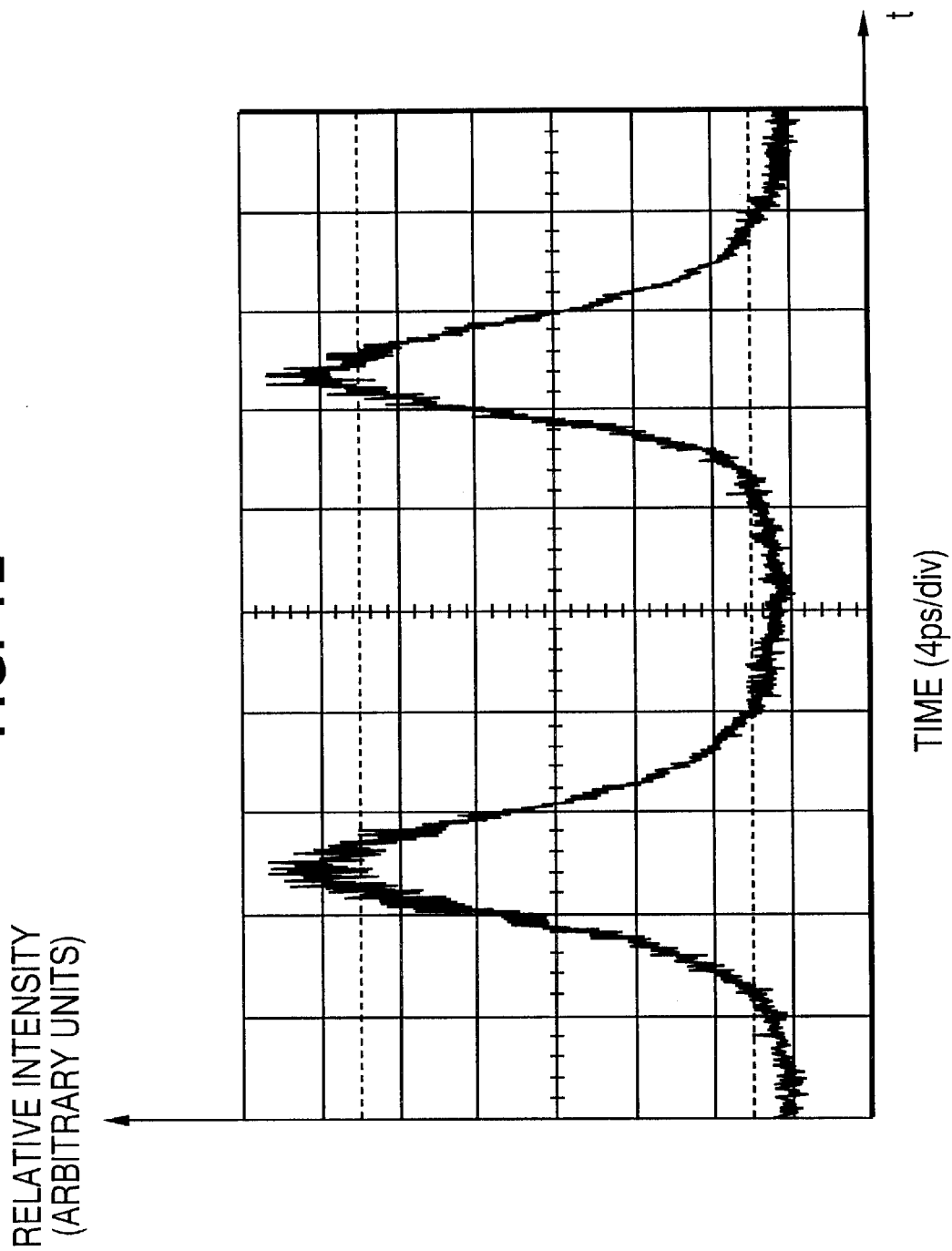
FIG. 12 shows an autocorrelation trace of an optical pulse train after pulse compression for the input spectrum of FIG. 9 and the output spectrum of FIG. 11.
Figure 13:
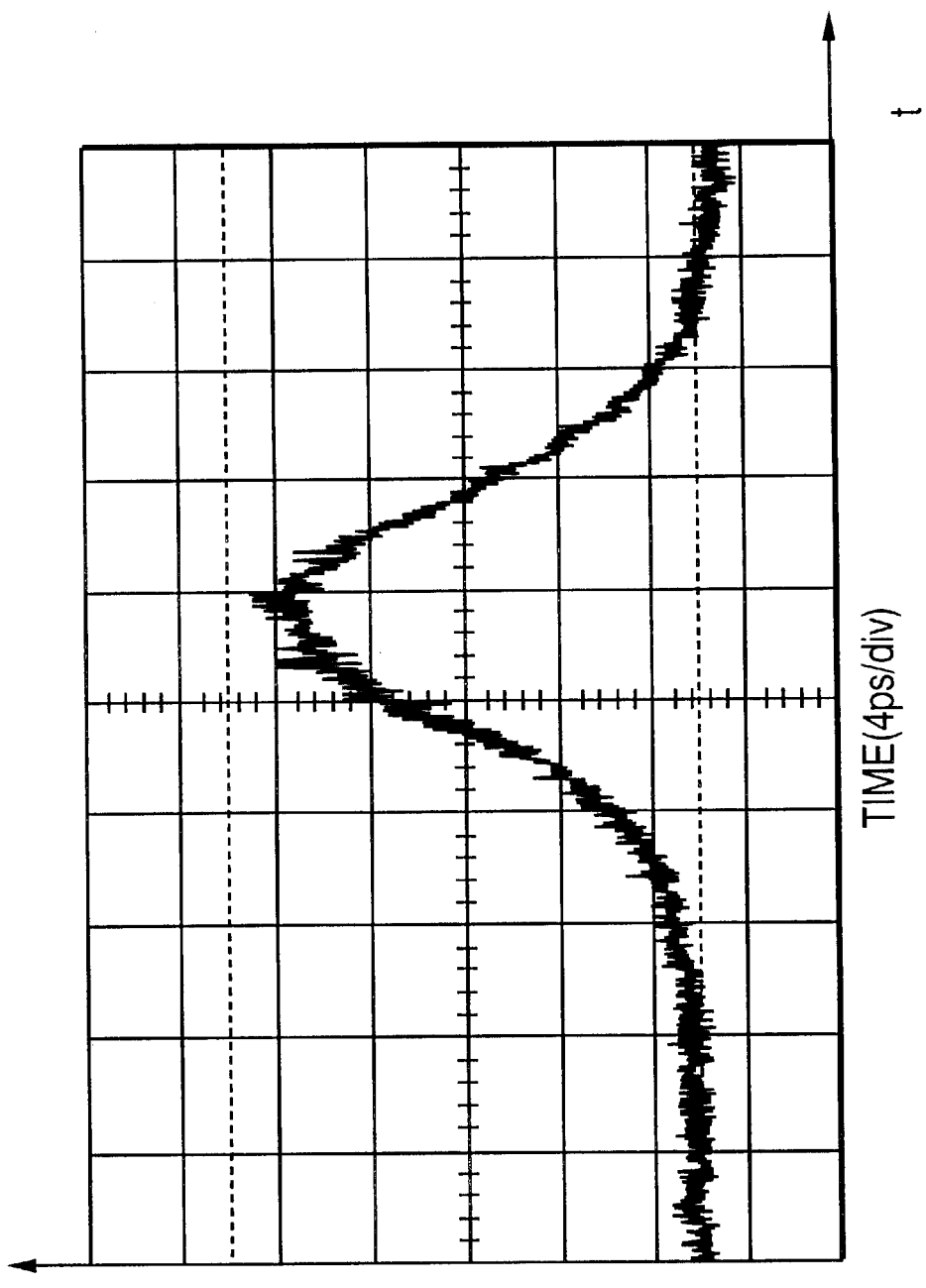
FIG. 13 shows an autocorrelation trace of an optical pulse train after pulse compression corresponding to a beat frequency of 25 GHz.
Figure 14:
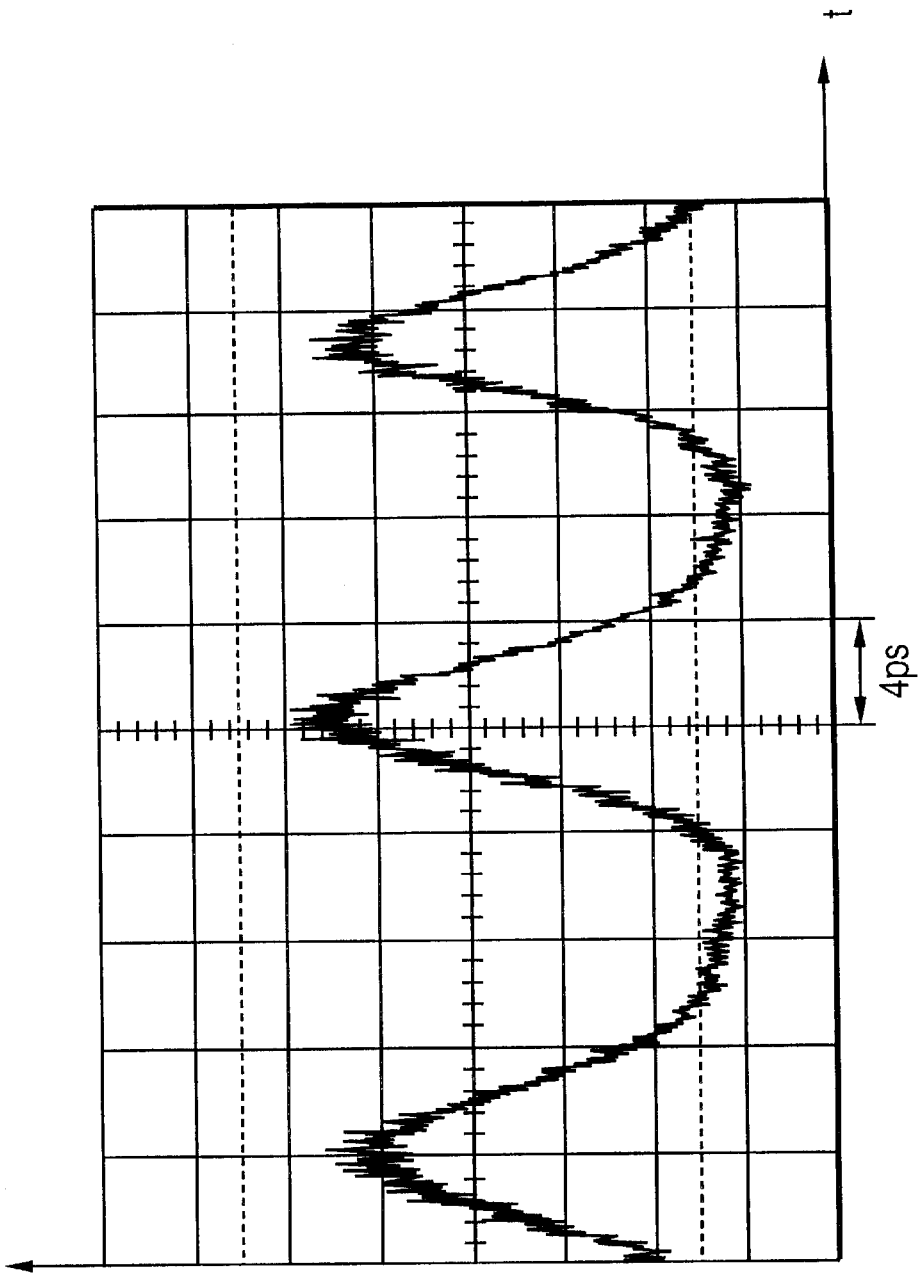
FIG. 14 shows an autocorrelation trace of an optical pulse train after pulse compression corresponding to a beat frequency of 70 GHz.

FIG. 11 shows an optical spectrum after the beat signal has traveled through the optical compressor including two fiber sections. It is seen that dual wavelength light shown in FIG. 9 becomes a comb of wavelengths through nonlinear phase modulation process of the nonlinear optical fiber. The corresponding autocorrelation trace (time domain waveform) of the optical train after pulse compression shown in FIG. 12 is measured by an autocorrelator based on second harmonic generation. In this case, the pulse repetition rate is about 50 GHz (about 20 ps separation between pulses), and the pulse duration is approximately 5 ps (FWHM). As illustrated by FIG. 8, the pulse repetition rate can be varied continuously by adjusting the injection current of two lasers. By way of example, time domain waveforms for pulse repetition rates of 25 GHz and 70 GHz are shown in FIGS. 13 and 14 respectively. Narrower optical pulses can be obtained by further optimization of the optical compressor parameters, e.g. by selecting precise fiber lengths and using dispersion decreasing fibers.

In modifications to this embodiment the difference between laser frequencies may be provided by difference in temperature control of the lasers. Alternatively, it may be done by fabricating the active medium which has a different width for the first and second lasers, thus providing an effective difference in grating periods. For example, a different width of the laser stripe in ridge waveguide will change an effective modal index and as result will change an effective grating period. Other known techniques providing an effective difference in grating periods are also applicable.

Figure 15:
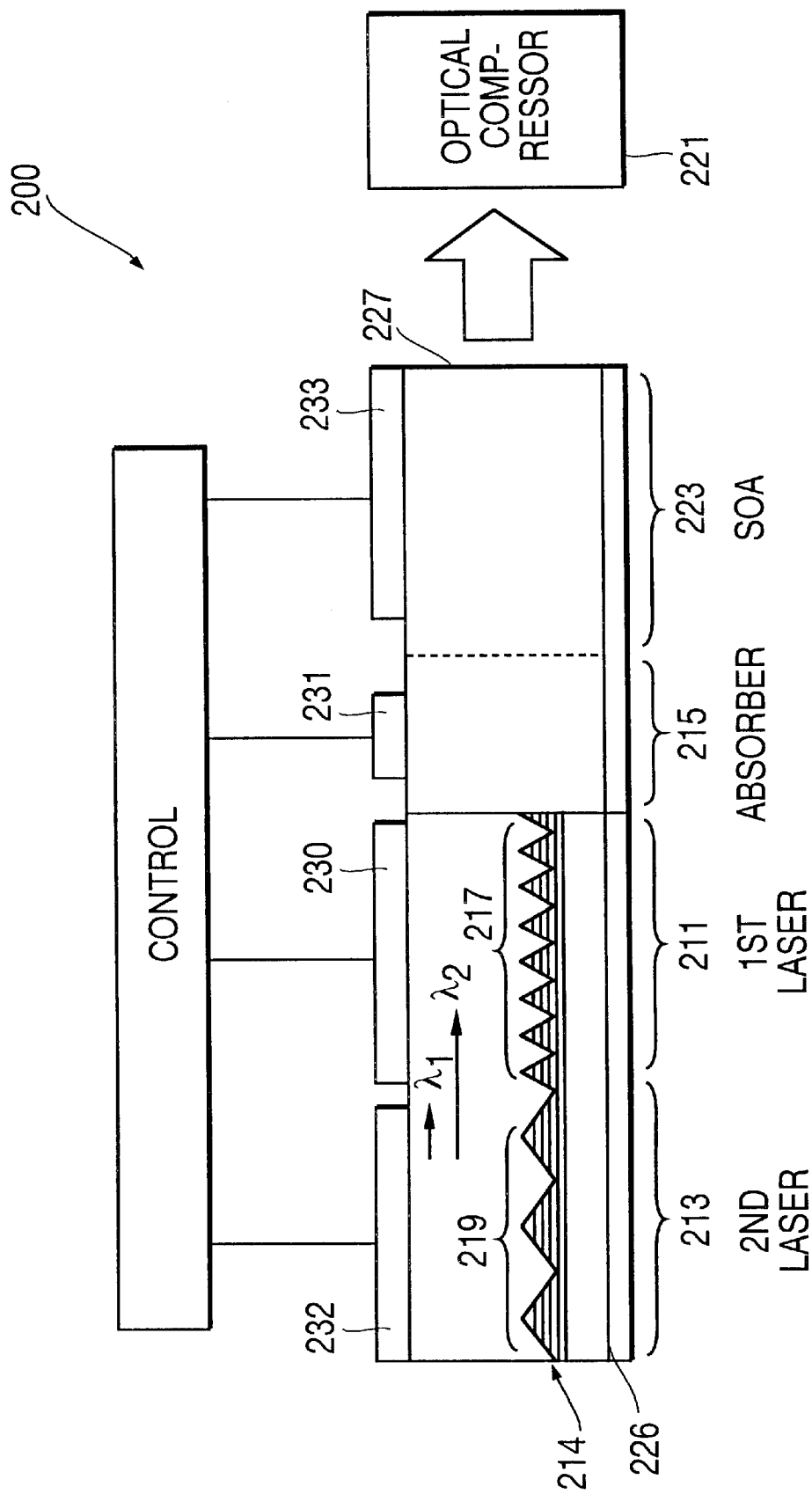
FIG. 15 is a schematic view of an optical pulse source according to a third embodiment of the invention.

A source 200 of short optical pulses according to a third embodiment of the invention is schematically shown in FIG. 15. This source 200 is similar to that shown in FIG. 7, and like elements are referred to by the same reference numeral incremented by 100. For example, a first laser 211 and a second laser 213 provide generation at two different wavelengths, the beat signal from which is sent to a saturable absorber 215 and SOA 223 followed by an optical compressor 221. The source 200 of the second embodiment differs from that of the second embodiment in that, instead of gain-coupled gratings 117 and 119 having same periods as shown in FIG. 7, the gratings 217 and 219 have different grating periods. A center Bragg wavelength separation of the gratings 217 and 219 is equal to 4.8 nm, the first grating 217 having a shorter Bragg wavelength. To provide a path to the output facet 227 for light generated by lasers 211 and 213, it is necessary to satisfy certain requirements on laser wavelengths and pumping conditions. It is known that when an active region is pumped just above a transparency level (and below a threshold level), a DFB laser becomes transparent for a light passing through if a wavelength of the passing light is outside of the stop band. The same laser becomes lossy and not transparent for the light passing through if the wavelength of the passing light is within the stop band, regardless of the fact that the laser is pumped above the transparency level. Moreover, when the wavelength of the passing light is far enough from the stop band of the laser, it passes through the laser without substantial interaction even if the laser is pumped above a threshold level and generates a stable lasing mode by itself. Thus, it is arranged that each laser in the source 200 generates at the same side of its stop band, namely at the right Bragg mode, and the Bragg modes of the lasers are arranged in such a way that the lasing wavelength (including intended current and temperature tuning) of the laser 211, which is closer to the output facet 227 of the source, does not fall within a stop band of the adjacent laser 213, which is further away from the output facet 227. It ensures that light generated by more distant laser 213 will pass through the laser 211 which is closer to the series output facet 227. Lasers 211 and 213 have a common active medium 214 and shared optical path to the output facet 227 and provide mutual injection of light into each other.

Figure 16:
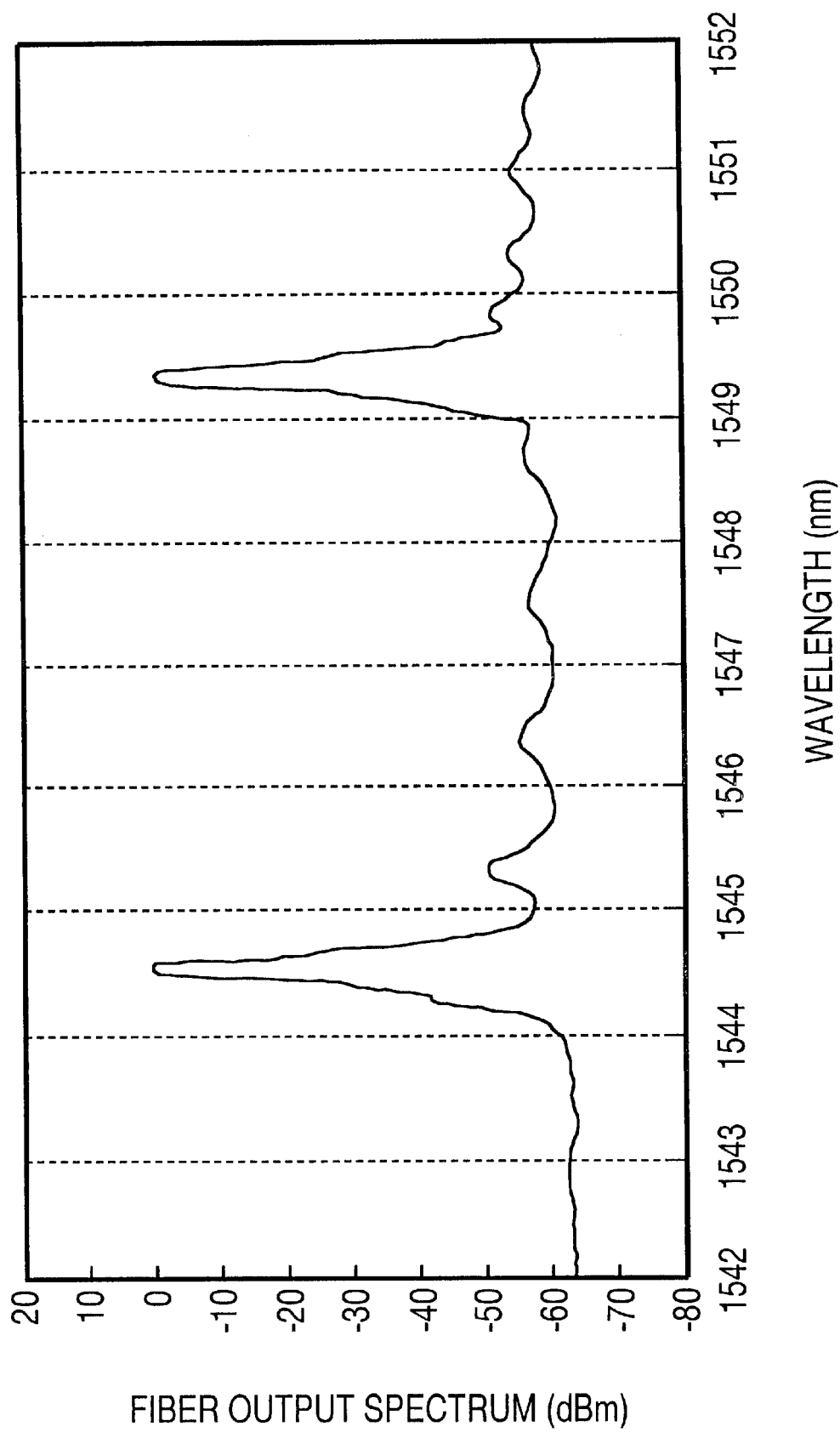
FIG. 16 shows a dual-wavelength operation of the laser structure of the source of FIG. 15.

FIG. 16 shows a dual wavelength operation of the laser structure of the source 200. There are clearly seen two stable Bragg modes separated by 4.8 nm from each other in the optical spectrum.

In modifications to this embodiment, the source 200 may comprise a first 211 and a second 213 strongly loss coupled DFB lasers, each laser comprising a loss coupling grating 217 and 219 correspondingly. The gratings will then have periods, defining corresponding laser stop bands and a center Bragg wavelength separation, the first grating 17 having longer Bragg wavelength. It is also arranged that each laser generates at the left Bragg mode around its stop band, and the lasing wavelength of the laser 211, which is closer to the output facet 227 of the series, does not fall within the stop band of the adjacent laser 213, which is further away from the output facet 227. Other arrangements of laser wavelengths providing stable dual wavelength operation of the laser structure of the source 200 are also applicable.

The wavelength spacing between the two modes in this embodiment is determined by a pre-set difference in effective Bragg wavelengths of the two lasers as shown in FIG. 15. When a large wavelength separation is required, e.g. in the case of high repetition rates, a pre-defined wavelength spacing can be set by using gratings with substantially different periods formed through either two different holographic exposures or an electron beam writing in such a way that the two gratings are joined together along the cavity direction. The frequency separation between the two modes, in general, can be designed to meet a large range in the order of several tens of GHz to several thousand GHz. According to the design, the separation can also be fine tuned by current injection and/or temperature variation depending on the system requirement.

In yet other modifications to this embodiment, gratings associated with particular lasers in the source may be either uniform or chirped gratings, and periods of the gratings may vary to provide a predetermined center Bragg wavelength separation (usually within a range of several nanometers to several tens of nanometers) to ensure continuous laser tuning within a certain wavelength range.

The optical pulse sources of the embodiments described above comprise semiconductor diode lasers, i.e. lasers having contacts for electrical excitation of the active region by current injection. It is also contemplated that a source 300 of a fourth embodiment shown in FIG. 17 may be provided with optical pumping means 330, 332, 331, 333, replacing corresponding electrical contacts 30, 32, 31 and 33 of the first embodiment (or corresponding electrical contact of the second or third embodiments), e.g. by providing population inversion with suitable optical coupling to another light source on the substrate. The structure and operation of the source 300 is similar to that shown in FIG. 7, and similar elements are referred to by the same reference numeral incremented by 200 respectively.

In modifications to this embodiment, the source 300 may comprise a combination of electrical and optical pumping means, e.g. the lasers 311 and 313 may be pumped optically while the absorber 331 and SOA 323 are pumped electrically by corresponding current injections. Various modifications described above with regards to other embodiments are also applicable to the fourth embodiment, e.g. the source 300 may include gratings having the same periods and provide generation of two wavelengths at different sides of the stopband, or alternatively, it may include gratings having different periods and providing a pre-set wavelength separation. Optionally it may further include a wavelength locking device for stabilizing one or two of generated wavelengths and/or sub-harmonic modulation of one or two lasers.

It is also contemplated that a source of alternative embodiments may comprise buried heterostructure lasers in contrast to the ridge waveguide lasers described in the above embodiments.

The source of optical pulses and microwave radiation described above have advantages over other similar structures which can be summarized as follows.

The source has a compact design due to manufacturing all the components on the same chip. It is capable of generating high frequency microwave and millimeter range radiation and short optical pulses of sub-picosecond to picosecond range with high and yet tunable repetition rate without the use of corresponding high speed electronics. Since wavelength separation of the lasers can be varied within a large range, the optical system, employing such a short pulse generation and data encoding scheme, becomes flexible and versatile. It can also be made easily upgradable to a higher bit-rate system without the need to modify the system architecture. Since the wavelength separation of the dual wavelength lasers is determined by the DFB grating design, there is no practical limitation for the maximum wavelength separation and thus high optical pulse repetition up to tera-hertz can be achieved.

FABRICATION

Fabrication of the source of short optical pulses 10 according to the first embodiment shown in FIG. 2 proceeds in four stages as follows:

1. first epitaxial growth of substrate and multiple quantum well structure;
2. patterning of the grating structure;
3. second epitaxial growth of the overlying layers;
4. completion of the laser fabricating (e.g. ridge formation, contacts).

The prepared substrate 12 is loaded promptly into a commercially available CVD growth chamber, and a buffer layer 34 of InP followed by the first confinement region 35, including four layers of InGaAsP, is grown. The active medium 14, comprising eight 1% compressively strained P-doped InGaAsP quantum wells 44, separated by seven P-doped InGaAsP unstrained barriers 46, is grown next.

The wafer is then removed from the growth chamber and processed so as to form photo-lithographic gratings 17 and 19 by periodically etched grooves through the active medium 14. First, a dielectric such a $SiO_2$ (not shown) is grown on the surface of the wafer, and the groove pattern is created in the dielectric layer. The grooves are etched using reactive ion etching or wet chemical etching process. The residual dielectric is then removed. Using known crystal growth techniques, for example, a metal oxide chemical vapor deposition, an InP layer 52 is grown in the grooves. Etch stop layer 54 of InGaAsP grown between two buffer layers 56 and 58 of InP, followed by cladding layer 60 of InP and capping layer 62 of InGaAs complete the structure. Source fabrication is then completed using a standard process. For example, to form rectangular ridge waveguides 22 and 24 perpendicular to the grooves of the gratings 17 and 19, a ridge mask is provided on the substrate, and the ridges are formed by etching through the capping layer 62 and top cladding layer 60, the ridges being 2 $\mu$m nominal width. The split top electrodes 30 and 32 are defined by the mask used in the metalization step and created in the lift-off process. The output facet 27 of the series is AR-coated (anti-reflection coated). The back facet may be AR-coated, as-cleaved or HR-coated (high-reflection coated). Alternatively, after the second regrowth, when a current confining region is formed on the active region, a buried heterostructure may also be grown. A phase mask generated by Electron Beam (EB) lithography or a direct EB writing on wafer may be used as an alternative to a holographic grating printing process for grating formation. The saturable absorber 15 and SOA 23 are formed on the chip simultaneously with the laser structure. The lasers 11 and 13, the absorber 15 and SOA 23 are integrated within same package.

Thus, it will be appreciated that, while specific embodiments of the invention are described in detail above, numerous variations, modifications and combinations of these embodiments fall within the scope of the invention as defined in the following claims.

What is claimed is:

1. An optical pulse source, comprising:
    a first single mode DFB semiconductor laser having a first grating for generating light at a first frequency;
    a second single mode DFB semiconductor laser having a second grating for generating light at a second frequency;
    the lasers having a common active medium and shared optical path, the lasers providing mutual light injection into each other resulting in generation of a beat signal at a difference frequency of two lasers;
    a saturable absorber disposed to receive the beat signal for providing an initial time compression of the beat signal, thus transforming the beat signal into an initial train of optical pulses; and
    an optical compressor disposed to receive the initial train of optical pulses and compressing the pulse duration of the signal, thus forming a train of short optical pulses having a pre-determined duration and a repetition rate.

2. A source as defined in claim 1 further comprising an optical amplifier for amplifying the initial train of pulses.

3. A source as defined in claim 1 wherein the optical compressor comprises a dispersion decreasing fiber.

4. A source as defined in claim 1 wherein the optical compressor comprises a dispersion shifted fiber.

5. A source as defined in claim 1 wherein the optical compressor comprises an erbium doped fiber amplifier.

6. A source as defined in claim 2 wherein the optical amplifier comprises an erbium doped fiber amplifier.

7. A source as defined in claim 1 further comprising means for data encoding into the train of short pulses.

8. A source as defined in claim 7 wherein the means for data encoding comprises an optical modulator operating at a speed determined by the repetition rate.

9. A source as defined in claim 1 wherein the repetition rate of the pulse train is from approximately several tens GHz to approximately several hundred GHz.

10. A source as defined in claim 1 wherein the repetition rate of the pulse train is from approximately 20 GHz to approximately 80 GHz.

11. A source as defined in claim 1 wherein the duration of pulses in the pulse train is within a range from sub picoseconds to picoseconds.

12. A source as defined in claim 1 wherein first and second DFB lasers comprise one of the gain coupled and loss coupled DFB lasers.

13. A source as defined in claim 12 wherein the active medium includes a multiple quantum well structure.

14. A source as defined in claim 13 wherein the first and second gratings are formed by etching grooves directly through the multiple quantum well structure.

15. A source as defined in claim 14 wherein each grating has a period comprising a first section and a second section with substantially all quantum wells being etched away from the second section, thus providing no substantial photon emission in the second section and ensuring no substantial interaction between the lasers.

16. A source as defined in claim 1 further comprising means for stabilizing the frequency of one of the first and second lasers.

17. A source radiation as defined in claim 10 further comprising means for stabilizing the frequencies of both lasers.

18. A source as defined in claim 1 further comprising means for tuning frequencies of the first and second lasers.

19. A source as defined in claim 1 further comprising means for modulating light generated by one of the first and second lasers.

20. A source as defined in claim 19 wherein the modulation is provided at a frequency which is subharmonic to the beat frequency.

21. A source as defined in claim 1 further comprising means for modulating light generated by the lasers simultaneously.

22. A source defined in claim 1 wherein pumping of the active medium is provided by current injection into the active medium.

23. A source defined in claim 1 wherein pumping of the active medium is provided by an external optical pumping source.

24. A source as defined in claim 1 wherein the first and second gratings have same periods.

25. A source as defined in claim 24 wherein the first and second lasers generate light at the same side of stopband.

26. A source as defined in claim 25 wherein the difference between the first and second frequencies is provided by different current injection into the first and second lasers.

27. A source as defined in claim 25 wherein the difference between the first and second frequencies is provided by different width of the active medium in the first and second lasers.

28. A source as defined in claim 25 wherein the difference between the first and second frequencies is provided by difference in temperatures at which the first and second lasers are maintained.

29. A source as defined in claim 24 wherein the first and second lasers generate light at different sides of stopband.

30. A source as defined in claim 1 wherein the first and second gratings have different periods.

31. A source as defined in claim 30 wherein the frequency of one of the lasers which is remote from an output facet does not fall within a stopband of the other laser which is closer to the output facet so that light emitted by the remote laser can pass through the shared optical path to the output facet.

32. A source as defined in claim 1 wherein the first and second gratings comprise one of the uniform and chirped gratings.

33. A source as defined in claim 1 wherein the first and second gratings are first order gratings.

34. A source as defined in claim 1 wherein the first and second gratings are formed by one of the holographic writing and electron beam writing onto the active medium.

35. An optical pulse source, comprising:
a first single mode DFB semiconductor laser having a first grating for generating light at a first frequency;
a second single mode DFB semiconductor laser having a second grating for generating light at a second frequency;
the lasers having a common active medium and shared optical path, the lasers providing light injection of light imposed on each other resulting in generation of a beat signal at a difference frequency of two lasers;
a saturable absorber disposed for receiving the beat signal and providing an initial time compression thus transforming the beat signal into an initial train of optical pulses;
an optical amplifier disposed to receive the initial pulse train after the absorber;
an optical compressor disposed to receive the pulse train after the optical amplifier and compressing duration of pulses of the train, thus forming a train of short optical pulses having a pre-determined duration and a repetition rate,
the first and second lasers, the saturable absorber and the optical amplifier being formed on the same chip.

36. A source as defined in claim 35 wherein the first and second lasers, the saturable absorber and the optical amplifier are integrated within a package.

37. An source of radiation, comprising:
a first single mode DFB semiconductor laser having a first grating for generating light at a first frequency;
a second single mode DFB semiconductor laser having a second grating for generating light at a second frequency;
the lasers having a common active medium and shared optical path and providing mutual light injection into each other resulting in generation of radiation at a beat frequency of the first and second lasers,
wherein the first and second DFB lasers comprise one of the gain coupled and loss coupled DFB lasers,
wherein the active medium includes a multiple quantum well structure, and the first and second gratings are formed by etching grooves directly trough the multiple quantum well structures, and
wherein each grating has a period comprising a first section and a second section with substantially all of the quantum well structures being etched away from the second section, thus providing no substantial photon emission in the second section and ensuring no substantial interaction between the lasers.

38. A source of radiation comprising:
a first single mode DFB semiconductor laser having a first grating for generating light at a first frequency; and
a second single mode DFB semiconductor laser having a second grating for generating light at a second frequency;
the lasers having a common active medium and shared optical path and providing mutual light injection imposed on each other resulting in generation of radiation at a beat frequency of two lasers,
wherein the first and second gratings have different periods and
wherein the frequency of one of the lasers which is remote from an output facet does not fall within a stopband of the other laser which is closer to the output facet so that light emitted by the remote laser can pass through the shared optical path to the output facet.

39. An optical pulse source, comprising:
a first single mode DFB semiconductor laser having a first grating for generating light at a first frequency;
a second single mode DFB semiconductor laser having a second grating for generating light at a second frequency;
the lasers having a common active medium and shared optical path, the lasers providing mutual light injection into each other resulting in generation of a beat signal at a difference frequency of two lasers;
an optical compressor disposed to receive the beat signal and compressing the pulse duration of the signal, thus forming a train of short optical pulses having a predetermined duration and a repetition rate; and
means for stabilizing the frequency of one of the first and second lasers.

40. A source as defined in claim 39, further comprising a saturable disposed to receive the beat signal before it is received by the compressor, the absorber providing an initial time compression of the signal, thus transforming the beat signal into an initial train of optical pulses.

41. A source as defined in claim 40, further comprising an optical amplifier for amplifying the initial train of pulses.

42. A source as defined in claim 39, wherein the optical compressor comprises a dispersion decreasing fiber.

43. A source as defined in claim 39, wherein the optical compressor comprises a dispersion shifted fiber.

44. A source as defined in claim 39, wherein the optical compressor comprises an erbium doped fiber amplifier.

45. A source as defined in claim 41, wherein the optical amplifier comprises an erbium doped fiber amplifier.

46. A source as defined in claim 39, further comprising means for data encoding into the train of short pulses.

47. A source as defined in claim 46, wherein the means for data encoding comprises an optical modulator operating at a speed determined by the repetition rate.

48. A source as defined in claim 39, wherein the repetition rate of the pulse train is from about several tens GHz to about several hundred GHz.

49. A source as defined in claim 39, wherein the repetition rate of the pulse train is from about 20 GHz to about 80 GHz.

50. A source as defined in claim 39, wherein the duration of the pulses in the pulse train is within a range from sub picoseconds to picoseconds.

51. A source as defined in claim 39, wherein the first and second DFB lasers comprise one of the gain coupled and loss coupled DFB lasers.

52. A source as defined in claim 51, wherein the active medium includes a multiple quantum well structure.

53. A source as defined in claim 52, wherein the first and second gratings are formed by etching grooves directly through the multiple quantum well structure.

54. A source as defined in claim 53, wherein each of said first and second gratings has a period comprising a first section and a second section with substantially all quantum wells being etched away from the second section, thus providing no substantial photon emission in the second section and ensuring no substantial interaction between the layers.

55. A source as defined in claim 49, further comprising means for stabilizing the frequencies of said first and second lasers.

56. A source as defined in claim 39, further comprising means for tuning the frequencies of the first and second lasers.

57. A source as defined in claim 39, further comprising means for modulating light generated by one of the first and second lasers.

58. A source as defined in claim 57, wherein the modulation is provided at a frequency which is subharmonic to the beat frequency.

59. A source as defined in claim 39, further comprising means for modulating light generated by the lasers simultaneously.

60. A source as defined in claim 39, wherein pumping of the active medium is provided by current injection into the active medium.

61. A source as defined in claim 39, wherein pumping of the active medium is provided by an external optical pumping source.

62. A source as defined in claim 39, wherein the first and second gratings have the same periods.

63. A source as defined in claim 62, wherein the first and second lasers generate light at the same side of the stopband.

64. A source as defined in claim 63, wherein the difference between the first and second frequencies is provided by a different current injection into the first and second lasers.

65. A source as defined in claim 63, wherein the difference between the first and second frequencies is provided by a different width of the active medium in the first and second lasers.

66. A source as defined in claim 63, wherein the difference between the first and second frequencies is provided by a difference in temperature at which the first and second lasers are maintained.

67. A source as defined in claim 62, wherein the first and second lasers generate light at different sides of the stopband.

68. A source as defined in claim 39, wherein the first and second gratings have different periods.

69. A source as defined in claim 68, wherein the frequency of one of the lasers which is remote from an output facet does not fall within a stopband of the other laser which is closer to the output facet so that light emitted by the remote laser can pass through the shared optical path to the output facet.

70. A source as defined in claim 39, wherein the first and second gratings comprise one of the uniform and chirped gratings.

71. A source as defined in claim 39, wherein the first and second gratings are first order gratings.

72. A source as defined in claim 39, wherein the first and second gratings are formed by one of the holographic writing and electron beam writing onto the active medium.

73. An optical pulse source, comprising:
a first single mode DFB semiconductor laser having a first grating for generating light at a first frequency;
a second single mode DFB semiconductor laser having a second grating for generating light at a second frequency;
the lasers having a common active medium and shared optical path, the lasers providing mutual light injection into each other resulting in generation of a beat signal at a difference frequency of two lasers; and
an optical compressor disposed to receive the beat signal and compressing the pulse duration of the signal, thus forming a train of short optical pulses having a predetermined duration and a repetition rate;
wherein the first and second gratings have different periods.

74. A source as defined in claim 73, further comprising a saturable disposed to receive the beat signal before it is received by the compressor, the absorber providing an initial time compression of the signal, thus transforming the beat signal into an initial train of optical pulses.

75. A source as defined in claim 74, further comprising an optical amplifier for amplifying the initial train of pulses.

76. A source as defined in claim 73, wherein the optical compressor comprises a dispersion decreasing fiber.

77. A source as defined in claim 73, wherein the optical compressor comprises a dispersion shifted fiber.

78. A source as defined in claim 73, wherein the optical compressor comprises an erbium doped fiber amplifier.

79. A source as defined in claim 75, wherein the optical amplifier comprises an erbium doped fiber amplifier.

80. A source as defined in claim 73, further comprising means for data encoding into the train of short pulses.

81. A source as defined in claim 80, wherein the means for data encoding comprises an optical modulator operating at a speed determined by the repetition rate.

82. A source as defined in claim 73, wherein the repetition rate of the pulse train is from about several tens GHz to about several hundred GHz.

83. A source as defined in claim 73, wherein the repetition rate of the pulse train is from about 20 GHz to about 80 GHz.

84. A source as defined in claim 73, wherein the duration of the pulses in the pulse train is within a range from sub picoseconds to picoseconds.

85. A source as defined in claim 73, wherein the first and second DFB lasers comprise one of the gain coupled and loss coupled DFB lasers.

86. A source as defined in claim 85, wherein the active medium includes a multiple quantum well structure.

87. A source as defined in claim 86, wherein the first and second gratings are formed by etching grooves directly through the multiple quantum well structure.

88. A source as defined in claim 87, wherein each of said first and second gratings has a period comprising a first section and a second section with substantially all quantum wells being etched away from the second section, thus providing no substantial photon emission in the second section and ensuring no substantial interaction between the layers.

89. A source as defined in claim 73, further comprising means for stabilizing the frequency of one of the first and second lasers.

90. A source as defined in claim 83, further comprising means for stabilizing the frequencies of said first and second lasers 91. A source as defined in claim 73, further comprising means for tuning the frequencies of the first and second lasers.

92. A source as defined in claim 73, further comprising means for modulating light generated by one of the first and second lasers.

93. A source as defined in claim 92, wherein the modulation is provided at a frequency which is subharmonic to beat the frequency.

94. A source as defined in claim 73, further comprising means for modulating light generated by the lasers simultaneously.

95. A source as defined in claim 73, wherein pumping of the active medium is provided by current injection into the active medium.

96. A source as defined in claim 73, wherein pumping of the active medium is provided by an external optical pumping source.

97. A source as defined in claim 73, wherein the first and second gratings have the same periods.

98. A source as defined in claim 97, wherein the first and second lasers generate at he same side of the stopband.

99. A source as defined in claim 98, wherein the difference between the first and second frequencies is provided by a different current injection into the first and second lasers.

100. A source as defined in claim 98, wherein the difference between the first and second frequencies is provided by a different width of the active medium in the first and second lasers.

101. A source as defined in claim 98, wherein the difference between the first and second frequencies is provided by a difference in temperature at which the first and second lasers are maintained.

102. A source as defined in claim 97, wherein the first and second lasers generate light at different sides of the stopband.

103. A source as defined in claim 73, wherein the frequency of one of the lasers which is remote from an output facet does not fall within a stopband of the other laser which is closer to the output facet so that light emitted by the remote laser can pass through the shared optical path to the output facet.

104. A source as defined in claim 73, wherein the first and second gratings comprise of the uniform and chirped gratings.

105. A source as defined in claim 73, wherein the first and second gratings are first order gratings.

106. A source as defined in claim 73, wherein the first and second gratings are formed by one of the holographic writing and electron beam writing onto the active medium.

* * * * *